(12) United States Patent
Ochi et al.

(10) Patent No.: US 10,197,712 B2
(45) Date of Patent: Feb. 5, 2019

(54) LIGHT-DIFFUSING-MEMBER MANUFACTURING METHOD AND MANUFACTURING DEVICE

(71) Applicant: SHARP KABUSHIKI KAISHA, Osaka-shi (JP)

(72) Inventors: Sho Ochi, Osaka (JP); Yasushi Asaoka, Osaka (JP); Tsuyoshi Maeda, Osaka (JP); Toru Kanno, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 198 days.

(21) Appl. No.: 15/032,124

(22) PCT Filed: Oct. 28, 2014

(86) PCT No.: PCT/JP2014/078623
§ 371 (c)(1),
(2) Date: Apr. 26, 2016

(87) PCT Pub. No.: WO2015/064568
PCT Pub. Date: May 7, 2015

(65) Prior Publication Data
US 2016/0259097 A1    Sep. 8, 2016

(30) Foreign Application Priority Data

Oct. 30, 2013  (JP) .................................. 2013-225485

(51) Int. Cl.
*B29D 11/00*      (2006.01)
*G02B 5/02*       (2006.01)
(Continued)

(52) U.S. Cl.
CPC ...... *G02B 5/0268* (2013.01); *B29D 11/00798* (2013.01); *G02B 5/0231* (2013.01);
(Continued)

(58) Field of Classification Search
None
See application file for complete search history.

(56) References Cited

U.S. PATENT DOCUMENTS 5,879,863 A * 3/1999 Azuma .................... G03F 7/11
430/322
2014/0160410 A1* 6/2014 Yamamoto ....... B29D 11/00798
349/112

FOREIGN PATENT DOCUMENTS

JP        09090644 A  *  4/1997
JP     2006-003668         1/2006
(Continued)

OTHER PUBLICATIONS

JP-2006003668-A Machine translation perfomed by JPO Jan. 5, 2018. (Year: 2018).*

(Continued)

*Primary Examiner* — Lisa L Herring
(74) *Attorney, Agent, or Firm* — ScienBiziP, P.C.

(57) ABSTRACT

A light-diffusing-member manufacturing method includes a step of forming a light diffusion portion on one surface side of a base, by developing an exposed negative photosensitive resin layer with an alkali developing solution, and a step of performing an acid treatment on the light diffusion portion with an acid solution, after removing the alkali developing solution which is adhered to the light diffusion portion and suspended matter in the alkali developing solution in the negative photosensitive resin layer, so as to lower an ionization degree of the negative photosensitive resin layer which is in an ionized state due to the alkali developing solution.

5 Claims, 12 Drawing Sheets

(51) Int. Cl.
  *G03F 7/40* (2006.01)
  *G02B 5/04* (2006.01)
  *G02B 5/20* (2006.01)
  *G02F 1/1335* (2006.01)
  *B29L 11/00* (2006.01)

(52) U.S. Cl.
  CPC ........... *G02B 5/0278* (2013.01); *G02B 5/045* (2013.01); *G02B 5/201* (2013.01); *G02F 1/133504* (2013.01); *G03F 7/40* (2013.01); *G03F 7/405* (2013.01); *B29L 2011/00* (2013.01)

(56) References Cited

FOREIGN PATENT DOCUMENTS

| | | |
|---|---|---|
| JP | 2006-091537 | 4/2006 |
| WO | WO 2012/053501 | 4/2012 |
| WO | WO 2012/081410 | 6/2012 |

OTHER PUBLICATIONS

JP2006003668A English Translation by Lingualinx Language Solutions, Inc., Jan. 2018. (Year: 2018).*
JP0990644A (JPH0990644A) Google Machine Translation Performed Apr. 11, 2018. (Year: 2018).*
International Search Report for PCT/JP2014/078623 dated Nov. 26, 2014, four pages.
Written Opinion of the ISA for PCT/JP2014/078623 dated Nov. 26, 2014, four pages.

* cited by examiner

LIGHT-DIFFUSING-MEMBER MANUFACTURING METHOD AND MANUFACTURING DEVICE

TECHNICAL FIELD

The present invention relates to a light-diffusing-member manufacturing method and manufacturing device.

This application is the U.S. national phase of International Application No. PCT/JP2014/078623, filed on Oct. 28, 2014 which designated the U.S. and claims the benefit of priority of the prior Japanese Patent Application No. 2013-225485, filed on Oct. 30, 2013, the entire content of which is incorporated herein by reference.

BACKGROUND ART

A liquid crystal display is widely used as a display of a portable electronic device including a cellular phone, or a television, a personal computer, or the like. However, in general, it has been known that the liquid crystal display has excellent viewability from the front side but has a narrow viewing angle in the related art, such that a variety of research for widening the viewing angle has been done. As one area of research, a configuration is conceivable in which a member that diffuses the light emitted from a display body such as a liquid crystal panel (hereinafter, referred to as a light diffusing member) is provided on the viewing side of the display body.

As the light diffusing member, for example, a light diffusing member is known which includes a light-transmissive substrate; a light diffusion portion having a tapered reflective surface formed on one surface of the light-transmissive substrate; and a light shielding portion formed in a region other than the region having the light diffusion portion formed therein, on the one surface of the light-transmissive substrate (for example, see PTL 1). The light diffusion portion is formed by applying ultraviolet rays from the light-transmissive substrate side, and by patterning a transparent negative photosensitive resin, using the light shielding portion as a mask.

CITATION LIST

Patent Literature

PTL 1: International Publication NO. 2012/081410

SUMMARY OF INVENTION

Technical Problem

In the related art, in the patterning of the negative photosensitive resin, after exposing the negative photosensitive resin, the unexposed portion is eluted with an alkali developing solution, is washed with water, and dried by dry air.

Since the light diffusion portion is in a swollen state of containing water, in the light diffusion portion formed by patterning a negative photosensitive resin using the method in the related art, if the light diffusing member having a long length is wound, there is a problem that the light diffusion portion is adhered to the light-transmissive substrate. In addition, since the light diffusion portion is in a state of containing water, there is a problem that the light diffusing member has a portion with poor drainage which is not completely dried. In this manner, in the state of the light diffusion portion containing water, there is a problem that the surface strength of the light diffusion portion is low, and the light diffusion portion is deformed if the light diffusing member having a long length is wound.

The present invention has been made in order to solve the above problems, and the object thereof is to provide a light-diffusing-member manufacturing method and manufacturing device which prevent a light diffusion portion of a light diffusing member, made of a negative photosensitive resin, from being in a state of containing water.

Solution to Problem

A light-diffusing-member manufacturing method according to an aspect of the present invention includes a step of forming a light shielding layer on one surface of a base with optical transparency; a step of forming a negative photosensitive resin layer with optical transparency so as to cover the light shielding layer on the one surface of the base; a step of exposing the negative photosensitive resin layer by irradiating the negative photosensitive resin layer with ultraviolet light, from a surface on an opposite side of the one surface of the base having the light shielding layer and the negative photosensitive resin layer formed therein, through the base at a region other than a region having the light shielding layer formed therein; a step of forming a light diffusion portion having a light-emitting end surface on the base side, and having a light incident end surface of a larger area than the area of the light-emitting end surface on the opposite side of the base side, on the one surface side of the base, by developing the negative photosensitive resin layer with an alkali developing solution, after the exposure; and a step of performing an acid treatment on the light diffusion portion with an acid solution, after removing the alkali developing solution which is adhered to the light diffusion portion and suspended matter (scum) in the alkali developing solution in the negative photosensitive resin layer, so as to lower an ionization degree of the negative photosensitive resin layer which is in an ionized state due to the alkali developing solution.

In the light-diffusing-member manufacturing method according to the aspect of the present invention, in the step of performing an acid treatment, it is preferable that the acid solution is diffused into the light diffusion portion by physical stimuli.

In the light-diffusing-member manufacturing method according to the aspect of the present invention, in the step of performing an acid treatment, it is preferable that the light diffusion portion and the acid solution are heated.

In the light-diffusing-member manufacturing method according to the aspect of the present invention, in the step of performing an acid treatment, it is preferable that the acid solution is vaporized, and the vaporized acid solution is diffused into the light diffusion portion.

A light-diffusing-member manufacturing device according to another aspect of the present invention includes means for forming a light diffusion portion having a light-emitting end surface on a base side, and having a light incident end surface of a larger area than the area of the light-emitting end surface on the opposite side of the base side, on the one surface side of the base, by developing a negative photosensitive resin layer with an alkali developing solution, the negative photosensitive resin layer being formed by exposing a negative photosensitive resin layer with optical transparency applied so as to cover a light shielding layer, on one surface of the base with optical transparency having the light shielding layer formed therein; and means for performing an acid treatment on the light diffusion portion with an acid solution, after removing the alkali developing solution which is adhered to the light diffusion portion and suspended matter (scum) in the alkali developing solution in the negative photosensitive resin layer, so as to lower an ionization degree of the negative photosensitive resin layer which is in an ionized state due to the alkali developing solution.

The light diffusing member may be manufactured by the light-diffusing-member manufacturing method according to the present invention.

A display according to still another aspect of the present invention includes the light diffusing member according to the present invention.

Advantageous Effects of Invention

According to the aspects of the present invention, it is possible to sufficiently cure a negative photosensitive resin forming a light diffusion portion, by removing water contained in the light diffusion portion.

DESCRIPTION OF EMBODIMENTS

Embodiments of a light-diffusing-member manufacturing method and manufacturing device of the present invention will be described.

In addition, the present embodiment is intended to specifically describe the gist of the invention for better understanding, and is not intended to limit the present invention, unless otherwise specified.

Light-Diffusing-Member Manufacturing Method and Manufacturing Device (1) First Embodiment A light-diffusing-member manufacturing method and manufacturing device will be described with reference to FIGS. 1 to 4.

Figure 1:
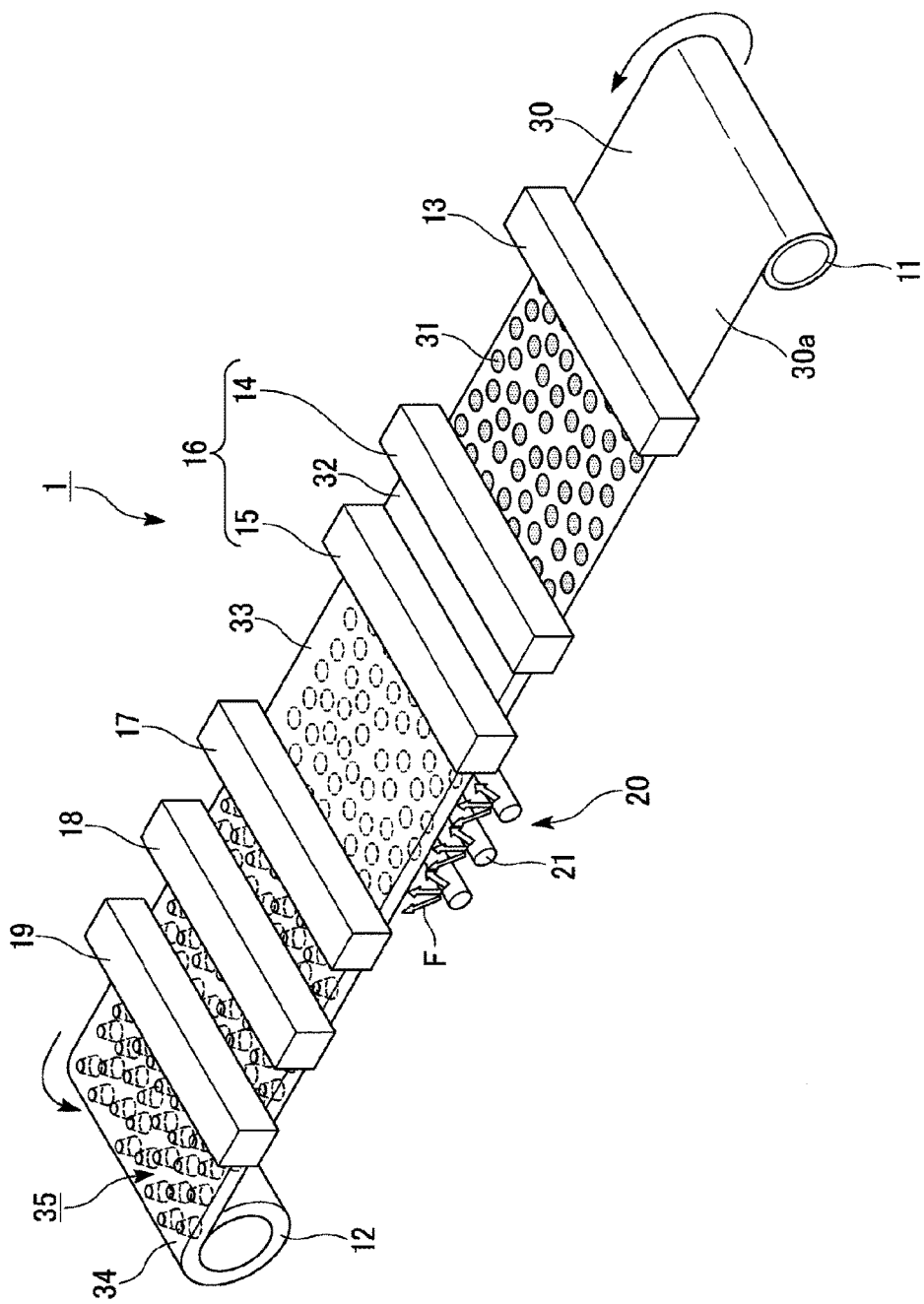
FIG. 1 is a schematic configuration diagram illustrating an example of a light-diffusing-member manufacturing device that is used in a light-diffusing-member manufacturing method.

FIG. 1 is a schematic configuration diagram illustrating an example of a light-diffusing-member manufacturing device that is used in a light-diffusing-member manufacturing method of the present embodiment.

The manufacturing device 1 illustrated in FIG. 1 is configured to transport a base 30 having a long length in a roll-to-roll manner, and performs various processes while being transported. In addition, the manufacturing device 1 uses a printing method for the formation of a light shielding layer 31.

As illustrated in FIG. 1, the manufacturing device 1 includes a sending roller 11 feeding the base 30 provided at one end, and a winding roller 12 winding the base 30 provided at the other end.

The base 30 is configured to move from a sending roller 11 side to the winding roller 12 side. A printer 13, a negative photosensitive resin layer forming device 16 including a bar coater 14 and a first drying device 15, a development device 17, an acid treatment device 18, and a second drying device 19 are sequentially disposed above the base 30, from the sending roller 11 side to the winding roller 12 side.

An exposure device 20 is disposed below the base 30.

The printer 13 prints the light shielding layer 31 made of a black resin, on the base 30.

When a light diffusion portion is formed using a negative photosensitive resin 32 having optical transparency, the bar coater 14 applies the negative photosensitive resin 32 having optical transparency on the light shielding layer 31.

In a case where a light diffusion portion is formed using the negative photosensitive resin 32 having optical transparency, the first drying device 15 dries the negative photosensitive resin 32 after application so as to form a coating film 33.

In addition, an example in which the negative photosensitive resin layer forming device 16 includes the bar coater 14 and the first drying device 15 is exemplified in the present embodiment, but the present embodiment is not limited thereto. In the present embodiment, in a case where the light diffusion portion is formed using a dry film resist, a laminating device laminating a dry film resist on the base 30 is used as the negative photosensitive resin layer forming device 16.

The development device 17 develops the negative photosensitive resin 32 (coating film 33) after exposure with an alkali developing solution.

The acid treatment device 18 removes insoluble matter for suspended matter (scum) in an alkali developing solution which is adhered to the light diffusion portion 34 including the negative photosensitive resin 32 (coating film 33) after development and an alkali developing solution in the negative photosensitive resin 32 (coating film 33), and thereafter performs an acid treatment on the light diffusion portion 34 with an acid solution.

The second drying device 19 dries the base 30 on which the light diffusion portion 34 after the acid treatment is formed.

The exposure device 20 performs exposure of the coating film 33 of the negative photosensitive resin 32 from the base 30 side. As illustrated in FIG. 1, the exposure device 20 is provided with a light source 21.

In the present embodiment, first, a light shielding layer 31 is formed on one surface 30a of the base 30 being transported, by a printing method using the printer 13 (light shielding layer formation step).

As the base 30, resins such as a thermoplastic polymer or a thermosetting resin, a photopolymerizable resin, or the like are generally used. A base made of appropriate transparent resins (optical transparency) such as acryl-based polymer, olefin-based polymer, vinyl-based polymer, cellulose-based polymer, amide-based polymer, fluorine-based polymer, urethane-based polymer, silicone-based polymer, and imide-based polymer can be used.

As the base 30, for example, a base made of transparent resins such as a triacetyl cellulose (TAC) film, a polyethylene terephthalate (PET) film, a cycloolefin polymer (COP) film, a polycarbonate (PC) film, a polyethylene naphthalate (PEN) film, a polyether sulfone (PES) film, and a polyimide (PI) film is preferably used.

The base 30 serves as a ground when applying the materials of the light shielding layer 31 and the light diffusion portion 34, and needs to have heat resistance and mechanical strength in the heat treatment step in the manufacturing process. Therefore, in addition to a base made of a resin, a base made of windable glass or the like may be used for the base 30.

However, it is preferable that the thickness of the base 30 is thinner to an extent that does not impair the heat resistance and mechanical strength. The reason is that there is a possibility of the occurrence of blurring of the display as the thickness of the base 30 is increased. Further, it is preferable that the total light transmittance of the base 30 is 90% or more in the provisions of the JIS K7361-1. If the total light transmittance is 90% or more, sufficient transparency is obtained.

As illustrated in FIG. 1, the light shielding layer 31 is non-periodically formed on one surface 30a of the base 30.

The light shielding layer 31 is made of, for example, an organic material having light absorption properties and photosensitivity such as black resist. In addition, the light shielding layer 31 may be made of a metal film such as a multilayer film of chromium (Cr) or Cr/Cr oxide, pigments and dyes used for black ink, or black-based ink containing mixed inks of multi-colors. In addition to these materials, any material having light shielding properties can be used as the material of the light shielding layer 31.

For example, the thickness of the light shielding layer 31 is set to be smaller than the height from the light incident end surface to the light-emitting end surface of the light diffusion portion 34.

Next, one surface 30a of the base 30 is coated with a negative photosensitive resin 32 by a bar coater 14 so as to cover the light shielding layer 31, the negative photosensitive resin 32 after application is dried by the first drying device 15, and thus a coating film (hereinafter, referred to as a "negative photosensitive resin layer") 33 is formed (negative photosensitive resin layer formation step).

The negative photosensitive resin 32 is made of, for example, an organic material with optical transparency and photosensitivity such as acrylic resin and epoxy resin. In the present embodiment, a material having the same refractive index as that of the base 30 is preferable as the negative photosensitive resin 32.

Next, the negative photosensitive resin layer 33 is exposed by the exposure device 20 applying the diffused light F including ultraviolet light to the negative photosensitive resin layer 33, in the normal to the one surface 30a of the base 30, through the base 30 of regions other than regions where the light shielding layer 31 is formed, from a surface on an opposite side of one surface 30a of the base 30 where the light shielding layer 31 and the negative photosensitive resin layer 33 are formed (negative photosensitive resin layer exposure step).

Figure 2:
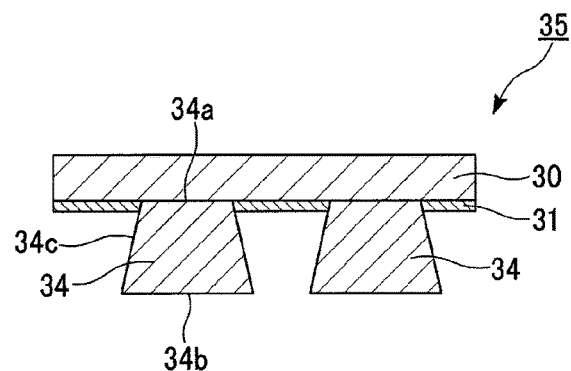
FIG. 2 is a schematic cross-sectional view illustrating an embodiment of a light diffusing member.

Next, as illustrated in FIG. 2, a light diffusion portion 34 including a light-emitting end surface 34a on the base 30 side and a light incident end surface 34b of an area larger than the area of the light-emitting end surface 34a on the opposite side of the base 30 side is formed on one surface 30a side of the base 30, by developing the exposed negative photosensitive resin layer 33 with the alkali developing solution, by the development device 17 (light diffusion portion formation step).

Next, the ionization degree of the light diffusion portion 34 made of the negative photosensitive resin layer 33 which is in an ionized state due to the alkali developing solution is lowered, by the acid treatment device performing the acid treatment on the light diffusion portion 34 with the acid solution, after removing the alkali developing solution which is adhered to the light diffusion portion 34 made of the negative photosensitive resin layer 33 after development and the suspended matter (scum) in the alkali developing solution in the negative photosensitive resin layer 33 (acid treatment step).

Here, a step in which an alkali developing solution and scum are removed and the acid treatment is performed on the light diffusion portion 34 with the acid solution (acid treatment step) in the present embodiment will be described.

Figure 3:
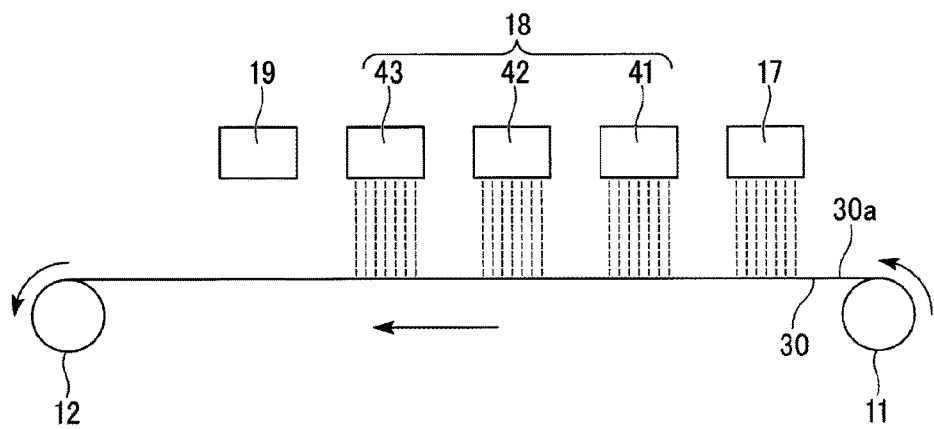
FIG. 3 is a schematic configuration diagram illustrating a first embodiment of an acid treatment device.
Figure 4:
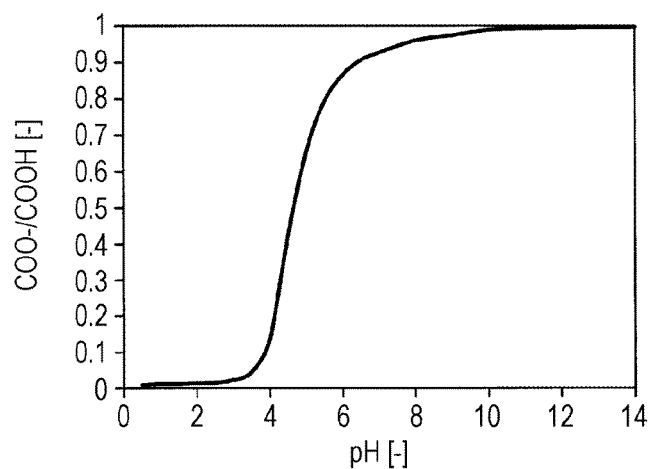
FIG. 4 is a graph illustrating a relationship between the ionization degree and pH of a main component polymer in a negative photosensitive resin.

In the present embodiment, for example, the configuration illustrated in FIG. 3 is used for the acid treatment device 18.

In addition, the light shielding layer 31, the negative photosensitive resin layer 33, and the light diffusion portion 34, which are formed on one surface 30a of the base 30, are omitted in FIG. 3.

The acid treatment device 18 includes a first water washing device 41, an acid device 42, and a second water washing device 43 in a schematic view. The first water washing device 41, the acid device 42, and the second water washing device 43 are arranged at set intervals in this order, in a transport direction (an arrow direction indicated in FIGS. 1 and 3) of the base 30.

The first water washing device 41 is configured to remove the alkali developing solution which is adhered to the light diffusion portion 34 and the suspended matter (scum) in the alkali developing solution in the negative photosensitive resin layer 33, by washing the light diffusion portion 34 made of the negative photosensitive resin layer 33 after development with pure water.

Examples of the first water washing device 41 include a device equipped with a shower nozzle for spraying pure water in a mist form into the light diffusion portion 34, a device including a mechanism for flowing pure water to the light diffusion portion 34, a device including a water bath for immersing the base 30 having the light diffusion portion 34 formed therein while transporting the base 30, and the like.

The acid device 42 is configured to perform acid treatment on the light diffusion portion 34 which is washed with water by the first water washing device 41 with the acid solution so as to lower the ionization degree of the light diffusion portion 34 which is in an ionized state due to an alkali developing solution.

Examples of the acid device 42 include a device equipped with a shower nozzle for spraying an acid solution in a mist form into the light diffusion portion 34, a device including a mechanism for flowing the acid solution to the light diffusion portion 34, a device including an acid solution bath containing the acid solution for immersing the base 30 having the light diffusion portion 34 formed therein while being transported, and the like.

The second water washing device 43 is configured to remove the acid solution which is adhered to the light diffusion portion 34, by washing the light diffusion portion 34 after the acid treatment with pure water.

Examples of the second water washing device 43 include a device equipped with a shower nozzle for spraying pure water in a mist form into the light diffusion portion 34, a device including a mechanism for flowing pure water to the light diffusion portion 34, a device including a water bath for immersing the base 30 which is being transported, and the like.

In other words, in the acid treatment step, first, the light diffusion portion 34 made of the negative photosensitive resin layer 33 after development is washed with pure water, by using the first water washing device 41.

Next, using the acid device 42, the acid treatment is performed on the light diffusion portion 34 which is washed with water by the first water washing device 41 with the acid solution, and thus the ionization degree of the light diffusion portion 34 which is in an ionized state due to an alkali developing solution is lowered.

Next, the acid solution which is adhered to the light diffusion portion 34 is removed by washing the light diffusion portion 34 after the acid treatment with pure water, using the second water washing device 43.

If the acid solution does not cause a chemical reaction with a material constituting the base 30, a material constituting the light shielding layer 31, and a material constituting the negative photosensitive resin layer 33 (light diffusion portion 34), it is not particularly limited, and inorganic acid or organic acid is used.

As the inorganic acid, for example, hydrochloric acid, sulfuric acid, phosphoric acid, sulfamic acid, or the like is used.

As the organic acid, for example, weak acid such as acetic acid, citric acid, propionic acid, tartaric acid, succinic acid, and oxalic acid, or strong acid such as benzene sulfonic acid is used.

Here, the effect of the acid treatment will be described.

In the development of the negative photosensitive resin layer 33 using an alkali developing solution in the light diffusion portion formation step, the main component polymer of the negative photosensitive resin is in an ionized state, in the unexposed portion of the negative photosensitive resin layer 33. The main component polymer which is in the ionized state is hydrated and eluted.

Meanwhile, an alkali developing solution is diffused near the surface layer thereof, in the exposed portion of the negative photosensitive resin layer 33, and the main component polymer of the negative photosensitive resin is in the ionized state.

For example, in a case where the main component polymer of the negative photosensitive resin is an acryl-based polymer, a functional group is a carboxyl group, such that the alkaline region is ionized as in the following equation (1).

$$R\text{---}COOH \rightarrow R\text{---}COO^- + H^+ \qquad (1)$$

If the main component polymer is ionized in this way, a repulsive force occurs between the polymer chains, water molecules can easily penetrate between the polymer chains, and as a result, the light diffusion portion 34 enters a state of being swollen with water. Therefore, the inside under the surface layer of the light diffusion portion 34 does not have a sufficiently dense structure, and lacks shape stability.

Thus, since the acid treatment is performed on the light diffusion portion 34 made of the negative photosensitive resin layer 33 after development, with an acid solution, the ionized state of R—COO⁻ represented by the above formula (1) is cancelled by changing the light diffusion portion 34 from the alkaline region to the acidic region, and the main component polymer becomes R—COOH. If the ionized state of the main component polymer is cancelled (the ionization degree of the main component polymer is lowered), the repulsive force does not occur between the polymer chains, such that the agglomeration of the polymer chains by hydrophobic interaction becomes stronger, water molecules are removed from the light diffusion portion 34, and the light diffusion portion 34 enters a shrink state. Thus, the inside under the surface layer of the light diffusion portion 34 has a sufficiently dense structure, and higher shape stability can be expected.

In this case, the lower the ionization degree of the main component polymer, the stronger the agglomeration of the polymer chains, and the larger the shrinkage of the light diffusion portion 34.

In addition, if the process proceeds to the acid treatment step from the light diffusion portion formation step (developing step), without water washing, the negative photosensitive resin eluted in the alkali developing solution diffusing into the vicinity of the surface of the light diffusion portion 34 may be re-precipitated, and have a non-uniform structure on the surface of the light diffusion portion 34 in some cases. From this fact, it is preferable to remove the negative photosensitive resin that has diffused into the vicinity of the surface of the light diffusion portion 34 by washing with water.

As described above, the main component polymer in the negative photosensitive resin capable of development with an alkali developing solution has a functional group indicating acidity. A relationship between the ionization degree and the pH of the main component polymer is represented by, for example, the curve illustrated in FIG. 4. This curve has an area where the ionization degree is increased greatly, as the pH of the main component polymer is changed to an alkaline condition from an acidic condition.

Therefore, in order to elute the unexposed portion of the negative photosensitive resin layer 33 with the alkali developing solution, and shrink and cure the surface of the exposed portion (light diffusion portion 34) of the negative photosensitive resin layer 33 with the acid solution, the pH of each of the alkali developing solution and the acid solution which are used in the present embodiment needs to be in the region where the ionization degree is increased greatly. In other words, it is necessary to select the alkali developing solution capable of eluting the unexposed portion of the negative photosensitive resin layer 33 from a region having a sufficiently high ionization degree (0.95 or more), and the acid solution indicating a pH up to a region having a sufficiently low ionization degree (0.05 or less), based on the ionization degree curve of the main component polymer of the negative photosensitive resin. In other words, the acid solution satisfying this condition is selected by adjusting the concentration thereof, as indicated above.

Further, in the acid treatment step, the light diffusion portion 34 is cured and shrinks by the acid solution diffusing into the inside under the surface layer of the light diffusion portion 34 which is swollen by the development using an alkali developing solution. In this case, in the light diffusion portion 34, the outermost surface, into which the acid solution is first diffused, is cured. Therefore, in a case where the diffusion rate of the acid solution to the interior of the light diffusion portion 34 is slower in comparison with the curing rate of the light diffusion portion 34, the outermost surface of the light diffusion portion 34 is cured, such that the acid solution is less likely to penetrate into the interior of the light diffusion portion 34, and the acid solution is prevented from being diffused into the interior of the light diffusion portion 34. In other words, it is considered that only the outermost surface is cured and the interior is not sufficiently cured, in the surface layer of the light diffusion portion 34 which was in a swollen state.

Therefore, as a method of promoting the acid solution to diffuse into the interior of the light diffusion portion 34, a method of diffusing the acid solution into the light diffusion portion 34 by physical stimuli is preferred. As such a method of diffusing the acid solution by physical stimuli, for example, a method is preferable, which sprays a misty acid solution into the light diffusion portion 34 by using an acid device 42 equipped with a shower nozzle for spraying the acid solution to the light diffusion portion 34 in a mist form. According to this method, it is possible to further diffuse the acid solution into the interior of the light diffusion portion 34, than in a case of using a method of flowing the acid solution into the light diffusion portion 34, or a method of immersing the base 30 which is being transported into an acid solution bath.

Next, the second drying device 19 dries the base 30 having the light diffusion portion 34 formed therein so as to obtain the light diffusing member 35.

As illustrated in FIG. 2, taken as a whole, the light diffusion portion 34 is formed such that the area of the light-emitting end surface 34a is smaller and the cross-sectional area in the horizontal direction is gradually increased as it moves away from the base 30. In other words, the light diffusion portion 34 has a trapezoidal shape in which the side on the light emitting side is short and the side on the light incident side is long, in the cross section in a certain vertical direction (a cross section in the normal direction of the base 30). Further, the light-emitting end surface 34a and the light incident end surface 34b of the light diffusion portion 34 are formed in parallel to each other.

Such a light diffusion portion 34 is a portion contributing to the transmission of light in the light diffusing member 35. In other words, the light which is incident from the light incident end surface 34b to the light diffusion portion 34 is totally reflected by the side surface 34c having a tapered shape of the light diffusion portion 34, is guided in a state of being substantially confined in the interior of the light diffusion portion 34, and is emitted from the light-emitting end surface 34a.

According to the present embodiment, water that has swollen the light diffusion portion 34 is removed, the light diffusion portion 34 shrinks, and the density is increased, by performing an acid treatment on the light diffusion portion 34 with the acid solution, after removing the alkali developing solution which is adhered to the light diffusion portion 34 made of the negative photosensitive resin layer 33 after development and the suspended matter (scum) in the alkali developing solution in the negative photosensitive resin layer 33. In other words, according to the present embodiment, it is possible to sufficiently cure the light diffusion portion 34.

Further, according to the present embodiment, in particular, since it is possible to sufficiently cure the negative photosensitive resin in the surface layer of the light diffusion portion 34, it is possible to increase the elastic modulus of the surface layer of the light diffusion portion 34. In other words, according to the present embodiment, it is possible to improve the intensity of the surface layer of the light diffusion portion 34.

Further, according to the present embodiment, after sufficiently curing the light diffusion portion 34 by performing an acid treatment on the light diffusion portion 34 with an acid solution, the base 30 having the light diffusion portion 34 formed therein is dried. In other words, since the light diffusion portion 34 is dried (heated) in a state where curing is sufficient (in a state where the light diffusion portion 34 is not swollen), it is possible to suppress deformation caused by heating of the light diffusion portion 34.

(2) Second Embodiment

A second embodiment of the light-diffusing-member manufacturing method and manufacturing device will be described with reference to FIG. 5.

The present embodiment is different from the above-mentioned first embodiment in that washing is not performed in order to remove an alkali developing solution and scum in the acid treatment step. All other components are similar to those in the above-mentioned first embodiment.

Figure 5:
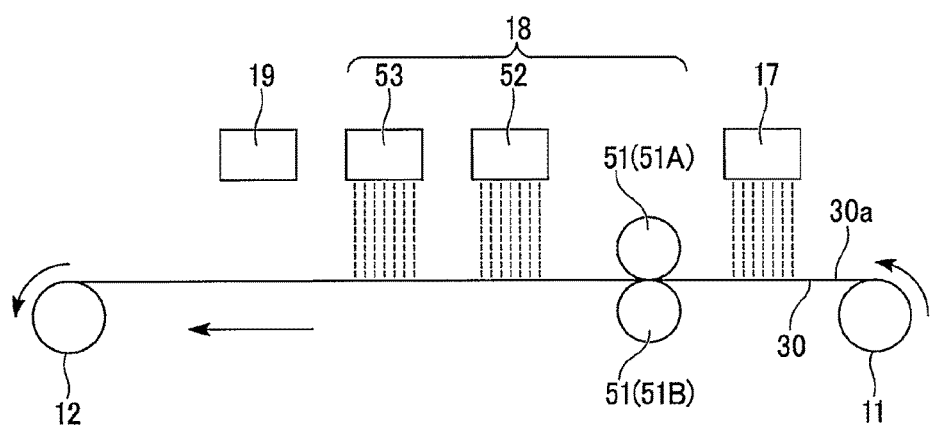
FIG. 5 is a schematic configuration diagram illustrating a second embodiment of the acid treatment device.

In the present embodiment, for example, the configuration illustrated in FIG. 5 is used for the acid treatment device 18.

In FIG. 5, the same components as those illustrated in FIG. 3 are denoted by the same reference numerals, and thus the description thereof will be omitted. In addition, in FIG. 5, the light shielding layer 31 and the negative photosensitive resin layer 33, which are formed on one surface 30a of the base 30, will be omitted.

An acid treatment device 18 includes a first adsorption roller 51, an acid device 52, and a water washing device 53, in a schematic view. The first adsorption roller 51, the acid device 52, and the water washing device 53 are arranged at intervals in this order, in a transport direction (an arrow direction indicated in FIG. 5) of the base 30.

The first adsorption roller 51 includes a pair of hygroscopic rollers 51A, 51B having the same shape, and is configured to adsorb and remove the alkali developing solution which is adhered to the light diffusion portion 34 and the suspended matter (scum) in the alkali developing solution in the negative photosensitive resin layer 33, by the pair of rollers 51A, 51B rotating and contacting both sides (the upper and lower surfaces of the paper in FIG. 5) of the base 30 having the light diffusion portion 34 made of the negative photosensitive resin layer 33 after development.

For example, those made of a sponge, a cloth made of a hygroscopic fiber, or the like are used for the hygroscopic rollers 51A, 51B.

The acid device 52 is configured to perform acid treatment on the light diffusion portion 34 from which the alkali developing solution and the insoluble matter (scum) are adsorbed and removed by the first adsorption roller 51, using an acid solution so as to lower the ionization degree of the light diffusion portion 34 which is in an ionized state due to an alkali developing solution.

Examples of the acid device 52 include a device equipped with a shower nozzle for spraying an acid solution in a mist form into the light diffusion portion 34, a device including a mechanism for flowing the acid solution to the light diffusion portion 34, a device including an acid solution bath containing the acid solution for immersing the base 30 having the light diffusion portion 34 formed therein while being transported, and the like.

The water washing device 53 removes the acid solution which is adhered to the light diffusion portion 34, by washing the light diffusion portion 34 after the acid treatment with pure water.

Examples of the water washing device 53 include a device equipped with a shower nozzle for spraying pure water in a mist form into the light diffusion portion 34, a device including a mechanism for flowing pure water to the light diffusion portion 34, a device including a water tank for immersing the base 30 which is being transported, and the like.

In other words, in the acid treatment step, first, the alkali developing solution which is adhered to the light diffusion portion 34 made of the negative photosensitive resin layer 33 after development and the suspended matter (scum) in the alkali developing solution in the negative photosensitive resin layer 33 are adsorbed and removed by the first adsorption roller 51.

Next, using the acid device 52, the acid treatment is performed on the light diffusion portion 34 from which the alkali developing solution and the insoluble matter (scum) are adsorbed and removed by the first adsorption roller 51 with the acid solution, and the ionization degree of the light diffusion portion 34 which is in an ionized state due to an alkali developing solution is lowered.

Next, the acid solution which is adhered to the light diffusion portion 34 is removed, by washing the light diffusion portion 34 after the acid treatment with pure water, using the water washing device 53.

Thereafter, the base 30 having the light diffusion portion 34 formed therein is dried by the second drying device 19, and thus the light diffusing member 35 is obtained.

According to the present embodiment, since the alkali developing solution which is adhered to the light diffusion portion 34 made of the negative photosensitive resin layer 33 after development and the suspended matter (scum) in the alkali developing solution in the negative photosensitive resin layer 33 is adsorbed and removed using the first adsorption roller 51, instead of the first water washing device 41 of the first embodiment, it is not necessary to collect water (waste water) used for washing the light diffusion portion 34, and thus it is possible to simplify the manufacturing step and the manufacturing device.

In addition, according to the present embodiment, the light diffusing member 35 including the light diffusion portion 34 similar to that of the first embodiment described above formed therein is obtained.

(3) Third Embodiment

A third embodiment of the light-diffusing-member manufacturing method and manufacturing device will be described with reference to FIG. 6.

The present embodiment is different from the above-mentioned first embodiment in that washing is not performed in order to remove an alkali developing solution and scum in the acid treatment step. All other components are similar to those in the above-mentioned first embodiment.

Figure 6:
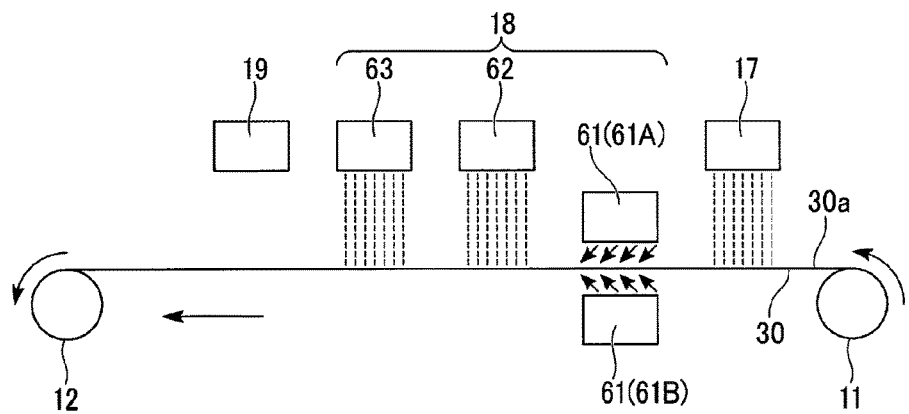
FIG. 6 is a schematic configuration diagram illustrating a third embodiment of the acid treatment device.

In the present embodiment, for example, the configuration illustrated in FIG. 6 is used for the acid treatment device 18.

In FIG. 6, the same components as those illustrated in FIG. 3 are denoted by the same reference numerals, and thus the description thereof will be omitted. In addition, the light shielding layer 31 and the negative photosensitive resin layer 33, which are formed on one surface 30a of the base 30, are omitted, in FIG. 6.

An acid treatment device 18 includes an air blowing device 61, an acid device 62, and a water washing device 63 in a schematic view. The air blowing device 61, the acid device 62, and the water washing device 63 are arranged at intervals in this order, in a transport direction (an arrow direction indicated in FIG. 6) of the base 30.

The air blowing device 61 includes a pair of air blowing devices 61A, 61B having the same structure, and the pair of air blowing devices 61A, 61B are oppositely disposed at both sides (the upper and lower surfaces of the paper in FIG. 6) of the base 30 having the light diffusion portion 34 made of the negative photosensitive resin layer 33 after development, and is configured to blow air to the light diffusion portion 34 from the air blowing devices 61A, 61B, and blow off and remove the alkali developing solution which is adhered to the light diffusion portion 34 and the suspended matter (scum) in the alkali developing solution in the negative photosensitive resin layer 33.

For example, a device which can uniformly blow air to the base 30 such as an air knife is used for the air blowing devices 61A, 61B.

The acid device 62 is configured to perform acid treatment on the light diffusion portion 34 from which the suspended matter (scum) in the alkali developing solution is blown off and removed by the air blowing device 61 with an acid solution so as to lower the ionization degree of the light diffusion portion 34 which is in an ionized state due to an alkali developing solution.

Examples of the acid device 62 include a device equipped with a shower nozzle for spraying an acid solution in a mist form into the light diffusion portion 34, a device including a mechanism for flowing the acid solution to the light diffusion portion 34, a device including an acid solution bath containing the acid solution for immersing the base 30 having the light diffusion portion 34 formed therein while being transported, and the like.

The water washing device 63 removes the acid solution which is adhered to the light diffusion portion 34, by washing the light diffusion portion 34 after the acid treatment with pure water.

Examples of the water washing device 63 include a device equipped with a shower nozzle for spraying pure water in a mist form into the light diffusion portion 34, a device including a mechanism for flowing pure water to the light diffusion portion 34, a device including a water tank for immersing the base 30 which is being transported, and the like.

In other words, in the acid treatment step, first, the alkali developing solution which is adhered to the light diffusion portion 34 made of the negative photosensitive resin layer 33 after development and insoluble matter (scum) which does not dissolve in the alkali developing solution in the negative photosensitive resin layer 33 are blown off and removed using the air blowing device 61.

Next, using the acid device 62, the acid treatment is performed on the light diffusion portion 34 from which the suspended matter (scum) in the alkali developing solution is blown off and removed by the air blowing device 61 with the acid solution, and the ionization degree of the light diffusion portion 34 which is in an ionized state due to an alkali developing solution is lowered.

Next, the acid solution which is adhered to the light diffusion portion 34 is removed, by washing the light diffusion portion 34 after the acid treatment with pure water, using the water washing device 63.

Thereafter, the base 30 having the light diffusion portion 34 formed therein is dried by the second drying device 19, and thus the light diffusing member 35 is obtained.

According to the present embodiment, since the alkali developing solution which is adhered to the light diffusion portion 34 made of the negative photosensitive resin layer 33 after development and the suspended matter (scum) in the alkali developing solution in the negative photosensitive resin layer 33 are blown off and removed, using the air blowing device 61, instead of the first water washing device 41 in the first embodiment, it is not necessary to collect water (waste water) used for washing the light diffusion portion 34, only the alkali developing solution and the insoluble matter (scum) may be collected as a waste liquid, and thus it is possible to reduce the amount of waste liquid.

In addition, according to the present embodiment, the light diffusing member 35 including the light diffusion portion 34 similar to that of the first embodiment described above formed therein is obtained.

(4) Fourth Embodiment

A fourth embodiment of the light-diffusing-member manufacturing method and manufacturing device will be described with reference to FIG. 7.

The present embodiment is different from the above-described first embodiment in that the acid solution is diffused into the light diffusion portion by physical stimuli in the acid treatment step. All other components are similar to those in the above-mentioned first embodiment.

Figure 7:
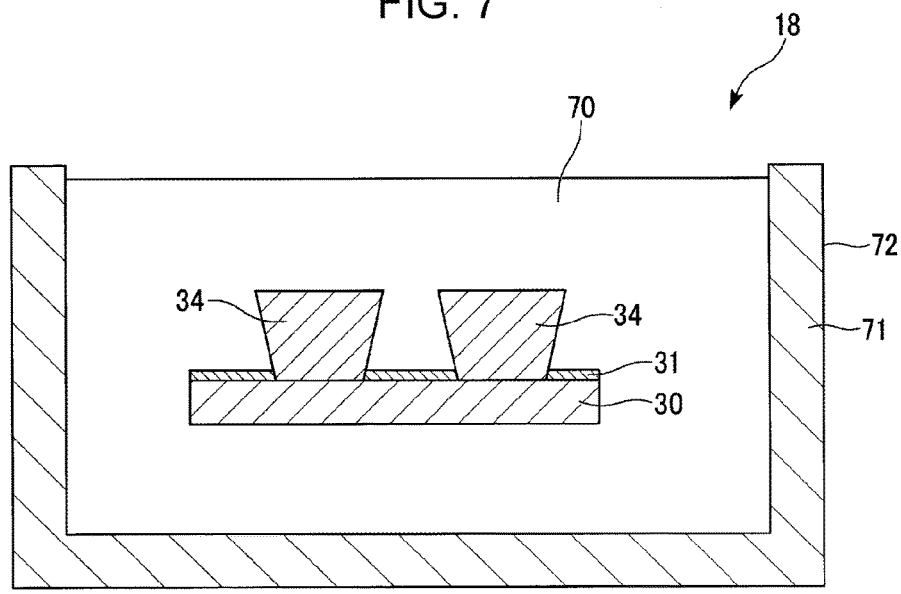
FIG. 7 is a schematic configuration diagram illustrating a fourth embodiment of the acid treatment device.

In the present embodiment, for example, the configuration illustrated in FIG. 7 is used for the acid treatment device 18.

In addition, the light shielding layer 31 and the negative photosensitive resin layer 33, which are formed on one surface 30a of the base 30, are omitted in FIG. 7.

The acid treatment device 18 includes a solution chamber 71 which accommodates an acid solution 70, and an ultrasonic device 72 which is attached to or built into the solution chamber 71 and equipped with an ultrasonic generator (not illustrated) that applies vibration caused by the ultrasound to the acid solution 70 in the solution chamber 71.

The light diffusion portion 34 made of the negative photosensitive resin layer 33 after development is washed with water, for example, using a first water washing device 41 illustrated in FIG. 3, and thereafter, the ultrasonic device 72 diffuses the acid solution into the light diffusion portion 34 by immersing the light diffusion portion 34 in the acid solution 70, and applying ultrasonic vibration to the acid solution 70, and performs an acid treatment on the light diffusion portion 34, so as to lower the ionization degree of the light diffusion portion 34 which is in an ionized state by the alkali developing solution.

Examples of the ultrasonic device 72 include a device provided with a solution chamber 71 containing the acid solution 70, which is capable of immersing, for example, the base 30 having the light diffusion portion 34 formed therein, while transporting the base 30. In addition, immersing the base 30 in the acid solution 70 while transporting the base 30 includes causing the base 30 to pass through the acid solution 70 while transporting the base 30.

In other words, in the acid treatment step, after washing the light diffusion portion 34 made of the negative photosensitive resin layer 33 after development with water, the acid solution 70 is diffused into the light diffusion portion 34 by immersing the light diffusion portion 34 in the acid solution 70 and applying ultrasonic vibration to the acid solution 70, using the ultrasonic device 72, and the light diffusion portion 34 is treated with acid, such that the ionization degree of the light diffusion portion 34 which is in an ionized state by the alkali developing solution is lowered.

Thereafter, the base 30 including the light diffusion portion 34 formed therein is washed with water by the second water washing device 43, and dried by the second drying device 19 so as to obtain a light diffusing member 35.

According to the present embodiment, since the acid solution is diffused into the light diffusion portion 34 by immersing the light diffusion portion 34 in the acid solution 70, and applying ultrasonic vibration to the acid solution 70, the diffusion rate of the acid solution 70 into the interior of the light diffusion portion 34 is prevented from being slower than the curing rate of the light diffusion portion 34, and thus the interior of the surface layer of the light diffusion portion 34 can be sufficiently cured.

In addition, according to the present embodiment, the light diffusing member 35 including the light diffusion portion 34 similar to that of the first embodiment described above formed therein is obtained.

(5) Fifth Embodiment

A fifth embodiment of the light-diffusing-member manufacturing method and manufacturing device will be described with reference to FIG. 8.

The present embodiment is different from the above-mentioned first embodiment in that an acid solution is diffused into a light diffusion portion by heating a light diffusion portion and an acid solution in the acid treatment step. All other components are similar to those in the above-mentioned first embodiment.

Figure 8:
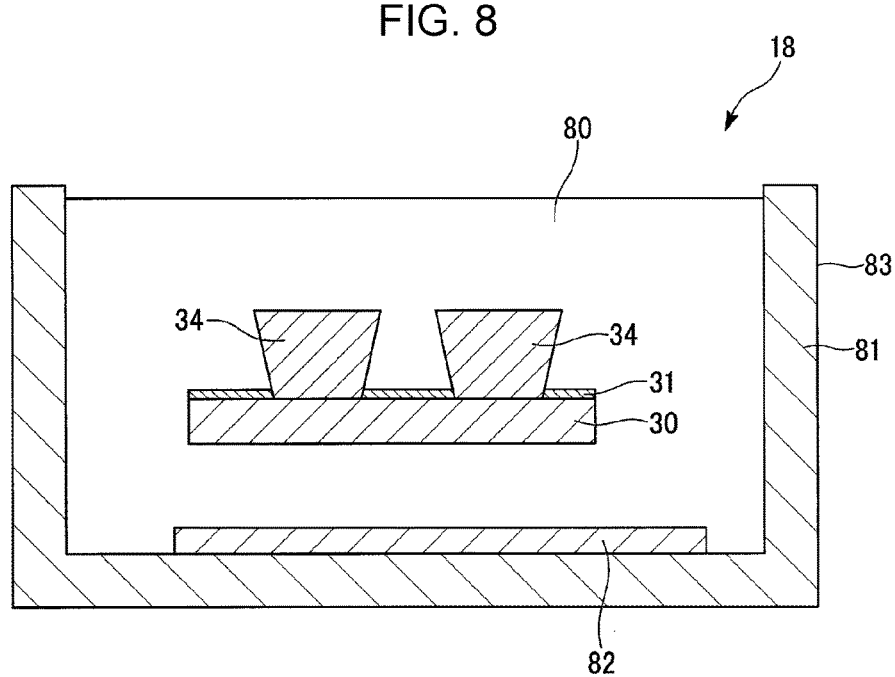
FIG. 8 is a schematic configuration diagram illustrating a fifth embodiment of the acid treatment device.

In the present embodiment, for example, the configuration illustrated in FIG. 8 is used for the acid treatment device 18.

In addition, the light shielding layer 31 and the negative photosensitive resin layer 33, which are formed on one surface 30a of the base 30, are omitted in FIG. 8.

The acid treatment device 18 includes a thermostatic device 83 equipped with a thermostatic bath 81 that accommodates an acid solution 80 and maintains the temperature of the acid solution 80 to a prescribed temperature, and a heater 82 that is disposed in the thermostatic bath 81 and heats the acid solution 80 in the thermostatic bath 81 and the base 30 having the light diffusion portion 34 formed therein.

After the light diffusion portion 34 made of the negative photosensitive resin layer 33 after development is washed with water by, for example, the first water washing device 41 illustrated in FIG. 3, the thermostatic device 83 is configured to diffuse the acid solution 80 into the light diffusion portion 34, by immersing the light diffusion portion 34 in the acid solution 80 and heating the acid solution 80 and the light diffusion portion 34 by the heater 82 so as to perform an acid treatment on the light diffusion portion 34 and to lower the ionization degree of the light diffusion portion 34 which is in an ionized state due to an alkali developing solution.

Examples of the thermostatic device 83 include a device equipped with the thermostatic bath 81 containing the acid solution 80, capable of immersing the base 30 having the light diffusion portion 34 formed therein while transporting the base 30, and the like. In addition, the process of immersing the base 30 in the acid solution 80 while transporting the base 30 includes causing the base 30 to pass through the acid solution 80 while transporting the base 30.

In other words, in the acid treatment step, after washing the light diffusion portion 34 made of the negative photosensitive resin layer 33 after development with water, the acid solution 80 is diffused into the light diffusion portion 34, by immersing the light diffusion portion 34 in the acid solution 80 and heating the acid solution 80 and the light diffusion portion 34 and thus an acid treatment is performed on the light diffusion portion 34, using the thermostatic device 83, such that the ionization degree of the light diffusion portion 34 which is in an ionized state due to an alkali developing solution is lowered.

Further, in the acid treatment step, the acid solution 80 is heated to a temperature of 30° C. or more and a boiling point (the boiling point of the acid solution 80) or less.

The acid solution 80 can be sufficiently diffused into the light diffusion portion 34 by setting the temperature thereof in the above range, without boiling the acid solution 80.

Thereafter, the base 30 having the light diffusion portion 34 formed therein is washed with water by the second water washing device 43, and is dried by the second drying device 19, and thus the light diffusing member 35 is obtained.

According to the present embodiment, since the acid solution is diffused into the light diffusion portion 34 by immersing the light diffusion portion 34 in the acid solution 80, and heating the acid solution 80 and the light diffusion portion 34, the diffusion rate of the acid solution 80 into the interior of the light diffusion portion 34 is prevented from being slower than the curing rate of the light diffusion portion 34, and thus the interior of the surface layer of the light diffusion portion 34 can be sufficiently cured.

In addition, according to the present embodiment, the light diffusing member 35 including the light diffusion portion 34 similar to that of the first embodiment described above formed therein is obtained.

(6) Sixth Embodiment

A sixth embodiment of the light-diffusing-member manufacturing method and manufacturing device will be described with reference to FIG. 9.

The present embodiment is different from the above-mentioned first embodiment in that an acid solution is diffused into a light diffusion portion through a vapor phase process rather than a liquid phase process in the acid treatment step. All other components are similar to those in the above-mentioned first embodiment.

Figure 9:
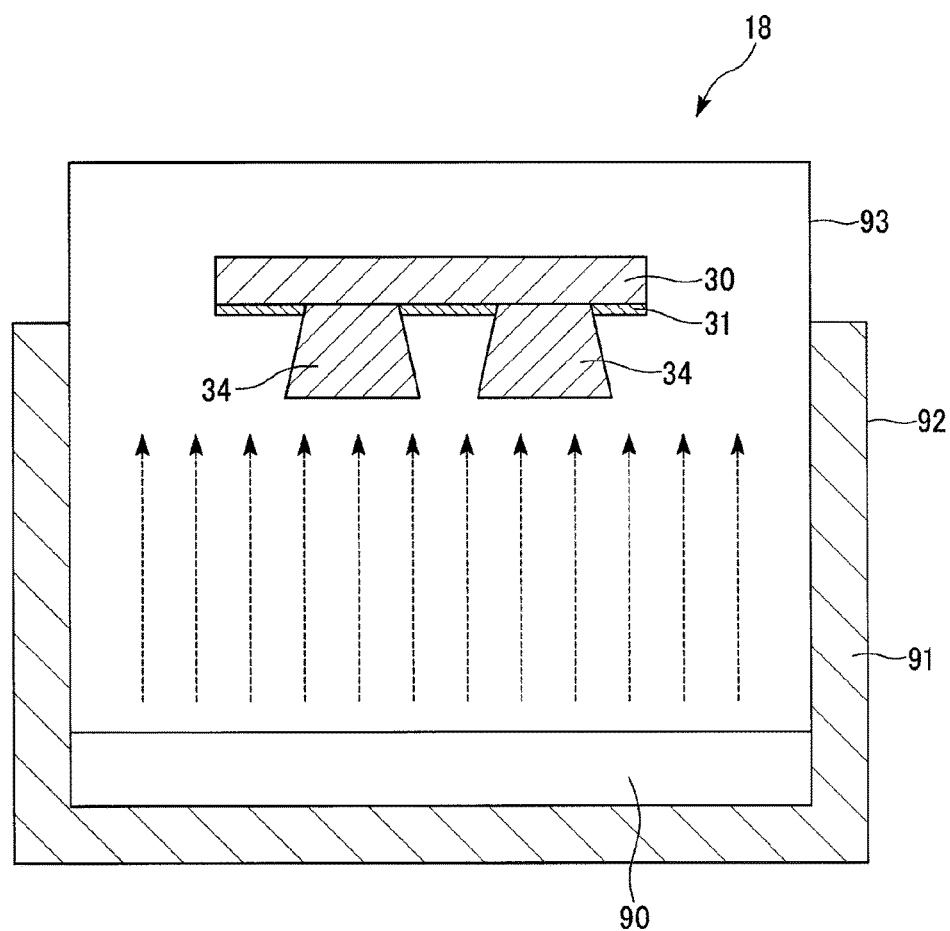
FIG. 9 is a schematic configuration diagram illustrating a sixth embodiment of the acid treatment device.

In the present embodiment, for example, the configuration illustrated in FIG. 9 is used for the acid treatment device 18.

In addition, the light shielding layer 31 and the negative photosensitive resin layer 33, which are formed on one surface 30a of the base 30, are omitted in FIG. 9.

The acid treatment device 18 includes a vapor phase acid treatment device 92 equipped with a thermostatic bath 91 that accommodates an acid solution 90, and a heater (not illustrated) that is attached to or built into the thermostatic bath 91, and heats and vaporizes the acid solution 90 in the thermostatic bath 91.

A hood 93 that covers the top of the thermostatic bath 91 and prevents the vaporized acid solution 90 from being scattered is provided in the vapor phase acid treatment device 92.

After the light diffusion portion 34 made of the negative photosensitive resin layer 33 after development is washed with water by, for example, the first water washing device 41 illustrated in FIG. 3, the vapor phase acid treatment device 92 is configured to vaporize the acid solution 90 in a thermostatic bath 91, diffuse the vaporized acid solution 90 (vaporized steam) into the light diffusion portion 34 so as to perform an acid treatment on the light diffusion portion 34, and to lower the ionization degree of the light diffusion portion 34 which is in an ionized state due to an alkali developing solution.

Examples of the vapor phase acid treatment device 92 include a device equipped with the thermostatic bath 91 containing the acid solution 90, capable of exposing the base 30 having the light diffusion portion 34 formed therein while transporting the base 30, and the like. In addition, a process of exposing the base 30 to the vaporized steam of the acid solution 90 while transporting the base 30 includes causing the base 30 to pass through the acid solution 90 while transporting the base 30.

In other words, in the acid treatment step, after washing the light diffusion portion 34 made of the negative photosensitive resin layer 33 after development with water, the acid solution 90 is vaporized in the thermostatic bath 91, and the vaporized acid solution 90 is diffused into the light diffusion portion 34, and thus an acid treatment is performed on the light diffusion portion 34, using the vapor phase acid treatment device 92, such that the ionization degree of the light diffusion portion 34 which is in an ionized state due to an alkali developing solution is lowered.

In the acid treatment step, the acid solution 90 is vaporized, and is diffused into the light diffusion portion 34, by heating the acid solution 90 to a temperature equal to or higher than a boiling point.

Thereafter, the base 30 having the light diffusion portion 34 formed therein is washed with water by the second water washing device 43, and is dried by the second drying device 19, and thus the light diffusing member 35 is obtained.

According to the present embodiment, since the vaporized acid solution 90 is diffused into the light diffusion portion 34 by vaporizing the acid solution 90 in the thermostatic bath 91, the diffusion rate of the acid solution 90 into the interior of the light diffusion portion 34 is prevented from being slower than the curing rate of the light diffusion portion 34, and thus the interior of the surface layer of the light diffusion portion 34 can be sufficiently cured.

In addition, according to the present embodiment, the light diffusing member 35 including the light diffusion portion 34 similar to that of the first embodiment described above formed therein is obtained.

In addition, in the above-mentioned first to sixth embodiments, a case in which the manufacturing device 1 includes the printer 13, the negative photosensitive resin layer forming device 16, the development device 17, the acid treatment device 18, and the exposure device 20 is exemplified, but the above-mentioned first to sixth embodiments are not limited thereto. In the first to sixth embodiments, the manufacturing device may include at least a development device and an acid treatment device. In this case, formation of the light shielding layer and the formation of the negative photosensitive resin layer in the base are performed by a separate device.

Light Diffusing Member and Display (1) First Embodiment

Figure 10:
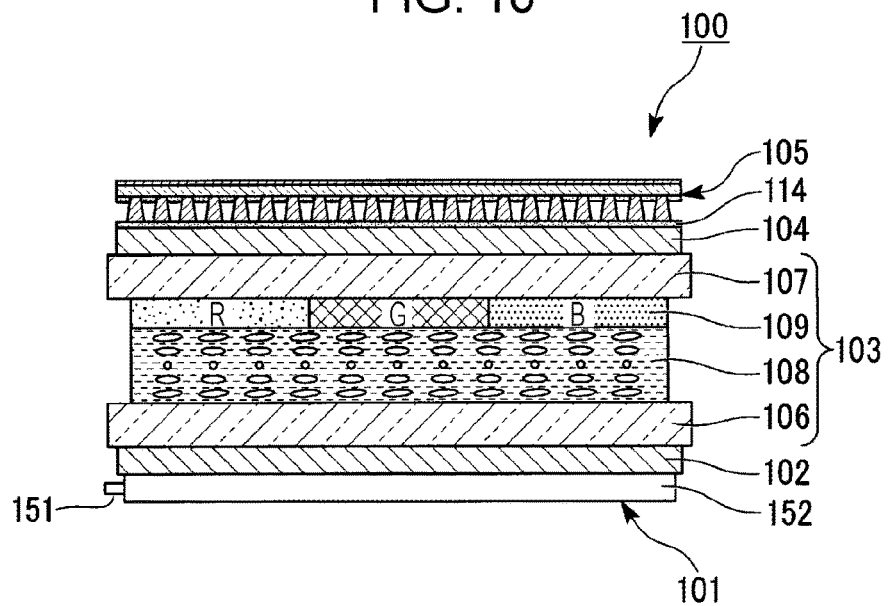
FIG. 10 is a vertical cross-sectional view illustrating a first embodiment of a liquid crystal display.
Figure 11:
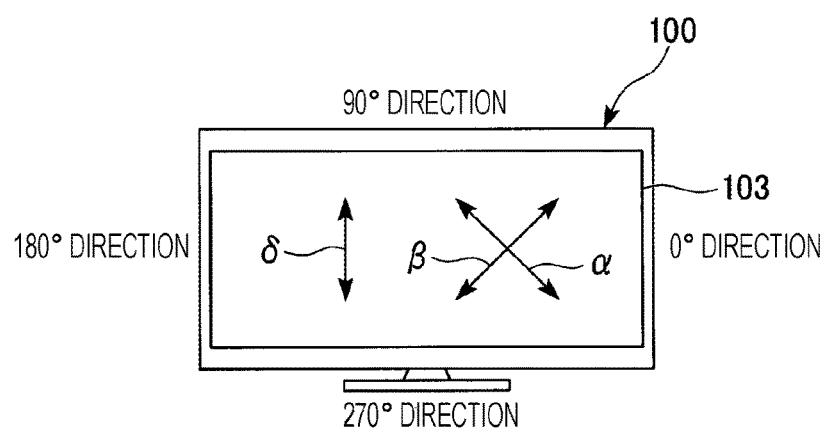
FIG. 11 is a diagram illustrating a strength scattering direction of a liquid crystal panel, an absorption axis direction of a first polarizer, and an absorption axis direction of a second polarizer.
Figure 12:
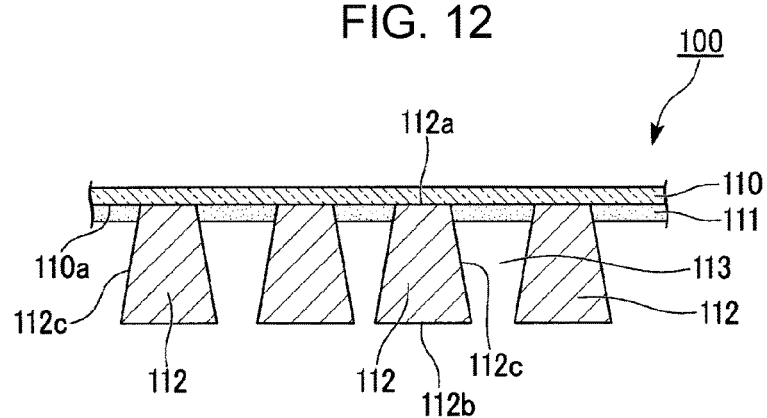
FIG. 12 is a schematic cross-sectional view illustrating a first embodiment of the light diffusing member.

FIG. 10 is a vertical cross-sectional view illustrating an embodiment of a liquid crystal display as an example of a display of the present embodiment. FIG. 11 is a diagram illustrating a strength scattering direction of a liquid crystal panel, an absorption axis direction of a first polarizer, and an absorption axis direction of a second polarizer, which respectively constitute the liquid crystal display of the present embodiment. FIG. 12 is a schematic cross-sectional view illustrating the light diffusing member of the present embodiment.

The liquid crystal display (display) 100 of the present embodiment includes a backlight (light source) 101, a first polarizer 102, a liquid crystal panel 103, a second polarizer 104, and a light diffusing member 105 in a schematic view.

Although FIG. 10 schematically illustrates the liquid crystal panel 103 of one sheet shape, the detailed configuration will be described later.

The observer sees the display from the upper side of the liquid crystal display 100 in FIG. 10 in which the light diffusing member 105 is disposed. Thus, in the following description, the side where the light diffusing member 105 is disposed is referred to as the viewing side, and the side where the backlight 101 is disposed is referred to as the back side.

In the liquid crystal display 100, the light emitted from the backlight 101 is modulated by the liquid crystal panel 103, and a prescribed image and characters are displayed by the modulated light. Further, if the light emitted from the liquid crystal panel 103 is transmitted through the light diffusing member 105, the light is emitted from the light diffusing member 105 in a state where the angular distribution of the emitted light is wider than that before entering the light diffusing member 105. Thus, the observer can view the display with a wide viewing angle.

The liquid crystal panel 103 includes a TFT substrate 106 in which a switching element and the like are formed, a color filter substrate 107 which is disposed to face the TFT substrate 106, a liquid crystal layer 108 which is interposed between the TFT substrate 106 and the color filter substrate 107 in a schematic view. In addition, a color filter 109 including dyes of respective colors of red (R), green (G), and blue (B) is provided on the opposite side of the liquid crystal layer 108 in the color filter substrate 107.

A member manufactured by any of the light-diffusing-member manufacturing methods and manufacturing devices of the first to sixth embodiments described above is used for the light diffusing member 105, in the liquid crystal display 100 of the present embodiment.

The light diffusing member 105 includes a base 110 having optical transparency, a plurality of light shielding layers 111 which are formed on one surface (a surface on the back side) 110a of the base 110, and a light diffusion portion 112 which is formed in a region other than the formation region of the light shielding layer 111 on the one surface 110a of the base 110 in a schematic view.

The light diffusion portion 112 has a light-emitting end surface 112a on the base 110 side, and a light incident end surface 112b having a larger area than the area of the light-emitting end surface 112a, on the opposite side of the base 110 side.

In addition, the height from the light emitting end surface emitting 112a to the light incident end surface 112b of the light diffusion portion 112 is larger than the thickness of the light shielding layer 111.

In addition, a space defined by the light shielding layer 111 and side surface 112c the light diffusion portion 112 is an air-cavity 113, and the air-cavity 113 is filled with gas such as air.

It may be configured such that at least one of an antireflection layer, a polarizing filter layer, an antistatic layer, an antiglare layer, and an antifouling layer is provided on the viewing side of the base 110 of the light diffusing member 105 (the opposite side of the one surface 110a). According to this configuration, depending on the type of layer provided on the viewing side of the base 110, it is possible to add a function of reducing the reflection of external light, a function of preventing the adhesion of dirt and dust, a function of preventing scratches, and the like, and to prevent the deterioration with time in the viewing angle characteristic.

It is preferable that the inclination angle of the side surface 112c of the light diffusion portion 112 (an angle made by the one surface 110a of the base 110 and the side surface 112c of the light diffusion portion 112) is 60° to 90°. The inclination angle of the side surface 112c of the light diffusion portion 112 is not particularly limited as long as the incident light sufficiently diffuses when emitting from the light diffusing member 105, at that inclination angle.

In addition, in the present embodiment, in the light diffusion portion 112, there are a large number of side surfaces 112c in the above-mentioned air-cavity 113 and the inclination angles of these side surfaces 112c are constant, but the present embodiment is not limited to thereto. Among the large number of side surfaces 112c, at least one inclination angle may be different from the inclination angle of the other side surface 112c. In addition, among the large number of side surfaces 112c, at least one inclination angle may be different depending on the location.

Further, in the light diffusing member 105, the planar shape of the light shielding layer 111 as viewed from the normal direction of viewing side (the opposite side of the one surface 110a) of the base 110 is not particularly limited, but it is preferred that the planar shape forms an anisotropic shape having at least a major axis and a minor axis.

Figure 13:
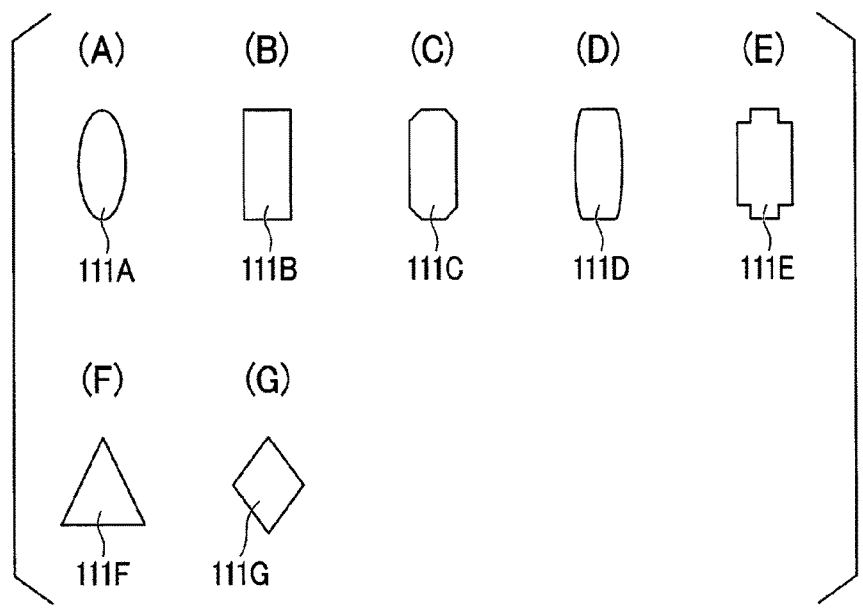
FIG. 13 is a schematic plan view illustrating a planar shape of a light shielding layer forming the light diffusing member.

Specifically, the light shielding layer 111 may be, for example, a light shielding layer 111A of an elongated elliptical shape, as illustrated in FIG. 13(A).

Alternatively, it may be a light shielding layer 111B of an elongated rectangular shape, as illustrated in FIG. 13(B).

Alternatively, it may be a light shielding layer 111C of an elongated octagonal shape, as illustrated in FIG. 13(C).

Alternatively, it may be a light shielding layer 111D of a shape with two opposing sides of an elongated rectangle being curved to the outside, as illustrated in FIG. 13(D).

Alternatively, it may be a light shielding layer 111E of a shape obtained by crossing two rectangles with different aspect ratios in two directions perpendicular to each other, as illustrated in FIG. 13(E).

Alternatively, it may be a light shielding layer 111F of an isosceles triangle shape, as illustrated in FIG. 13(F).

Alternatively, it may be a light shielding layer 111G of a diamond-like shape, as illustrated in FIG. 13(G).

In addition, respective light shielding layers 111 may have different plane shapes, and light shielding layers 111 of a plurality of types of different sizes and shapes with orientations of various types of anisotropy (see FIGS. 13(A) to (G)) may be mixed.

As the base 110 constituting the light diffusing member 105, resins such as a thermoplastic polymer, a thermosetting resin, a photopolymerizable resin, or the like are generally used. A base made of appropriate transparent resin (optical transparency) such as acryl-based polymer, olefin-based polymer, vinyl-based polymer, cellulose-based polymer, amide-based polymer, fluorine-based polymer, urethane-based polymer, silicone-based polymer, and imide-based polymer is used.

As the base 110, for example, a base made of transparent resins such as a triacetyl cellulose (TAC) film, a polyethylene terephthalate (PET) film, a cycloolefin polymer (COP) film, a polycarbonate (PC) film, a polyethylene naphthalate (PEN) film, a polyether sulfone (PES) film, and a polyimide (PI) film, a base made of windable glass, or the like is preferably used.

However, it is preferable that the thickness of the base 110 is thinner to an extent that does not impair the heat resistance and mechanical strength. The reason is that there is a possibility of the occurrence of blurring of the display as the thickness of the base 110 is increased. Further, it is preferable that the total light transmittance of the base 110 is 90% or more in the provisions of the JIS K7361-1. If the total light transmittance is 90% or more, sufficient transparency is obtained.

The light shielding layer 111 is made of, for example, an organic material having light absorption properties and photosensitivity such as black resist. In addition, the light shielding layer 111 may be made of a metal film such as a multilayer film of chromium (Cr) or Cr/Cr oxide, pigments and dyes used for black ink, or black-based ink containing mixed inks of multi-colors. In addition to these materials, any material having light shielding properties can be used as the material of the light shielding layer 111.

The light diffusion portion 112 is formed of by curing the negative photosensitive resin which is applied to one surface 110a of the base 110.

Examples of the negative photosensitive resin include an organic material having optical transparency and photosensitivity such as acrylic resin or epoxy resin.

In addition, the light diffusing member 105 is bonded to the second polarizer 104 through the adhesive layer 114. Specifically, the light incident end surface 112b of the light diffusion portion 112 of the light diffusing member 105 is bonded to the upper surface of the second polarizer 104, through the adhesive layer 114.

In addition, as illustrated in FIG. 11, the front surface shape of the screen of the liquid crystal panel 103 provided in the liquid crystal display 100 is a long (horizontally long) rectangle in a transverse direction. It is assumed that the horizontal direction of the screen is an azimuth angle φ: 0° to 180° direction. If briefly referring, the azimuth angle φ: 0° to 180° direction is the transverse direction (X direction) along the horizontal axis relative to the ground. Meanwhile, it is assumed that the vertical direction of the screen is an azimuth angle φ: 90° to 270° direction. If briefly referring, the azimuth angle φ: 90° to 270° direction is the vertical direction (Y direction) along the axis perpendicular to the ground.

Here, as illustrated in FIG. 11, the rubbing directions of the liquid crystal panel 103 are 45 degrees and 135 degrees, for example, the absorption axis direction (the arrow β direction) of the second polarizer 104 and the absorption axis direction (the arrow α direction) of the first polarizer 102 is aligned to the rubbing direction. In addition, in FIG. 11, the arrow α direction is the absorption axis direction of the first polarizer 102, the arrow β direction is the absorption axis direction of the second polarizer 104, and the arrow δ direction is the strength scattering direction of the liquid crystal panel 103.

Hereinafter, the specific configuration of the liquid crystal panel 103 will be described.

Here, a transmission type liquid crystal panel of an active matrix type is illustrated as the liquid crystal panel 103, but the liquid crystal panel applicable to the present embodiment is not intended to be limited to the transmission type liquid crystal panel of the active matrix type. The liquid crystal panel applicable to the present embodiment may be, for example, a semi-transmissive (a transmission and reflection combined type) a liquid crystal panel, or a reflection-type liquid crystal panel, and furthermore, each pixel may be a liquid crystal panel of a simple matrix type which is not provided with a switching thin film transistor (hereinafter, abbreviated as "TFT").

Figure 14:
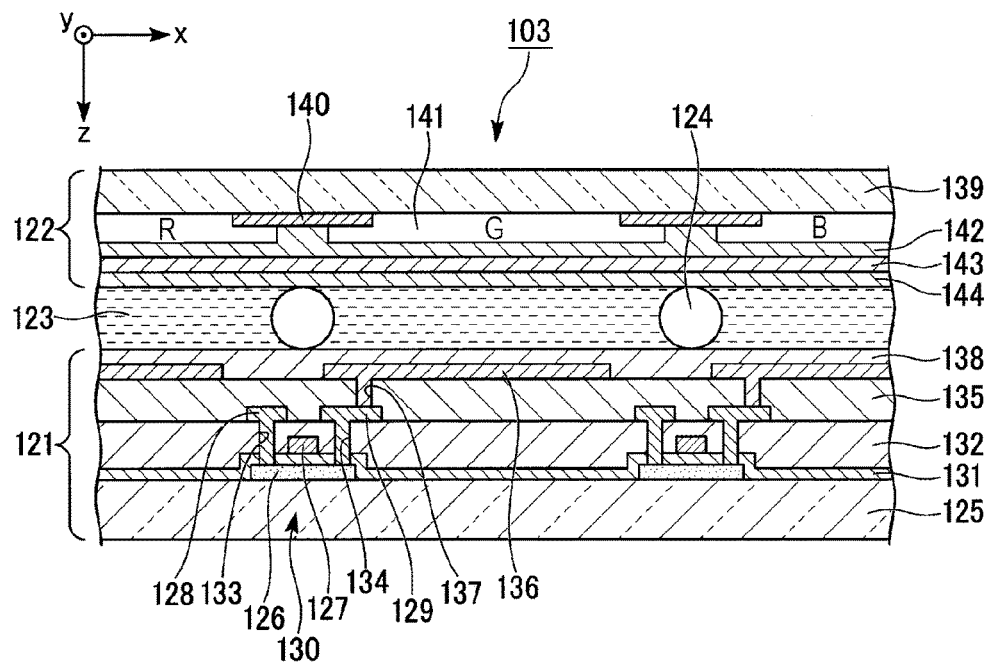
FIG. 14 is a vertical cross-sectional view of the liquid crystal panel.

FIG. 14 is a vertical cross-sectional view of the liquid crystal panel 103.

The liquid crystal panel 103 includes, as illustrated in FIG. 14, a TFT substrate 121 (corresponding to the TFT substrate 106 in FIG. 1) which is a switching element substrate, a color filter substrate 122 (corresponding to the color filter substrate 107 in FIG. 10) disposed to face the TFT substrate 121, and a liquid crystal layer 123 which is interposed between the TFT substrate 121 and the color filter substrate 122. The liquid crystal layer 123 is enclosed in a space surrounded by the TFT substrate 121, the color filter substrate 122, and a frame-shaped seal member (not illustrated) that bonds the TFT substrate 121 and the color filter substrate 122 at a prescribed interval. The liquid crystal panel 103 of the present embodiment is intended to perform display, for example, in a Twisted Nematic (TN) type, and a vertical alignment liquid crystal having negative dielectric anisotropy is used for the liquid crystal layer 123. A spherical spacer 124 for maintaining the interval between the substrates constantly is located between the TFT substrate 121 and the color filter substrate 122. It is to be noted that the display type is not limited to the above TN type, a vertical alignment (VA) type, a super twisted Nematic (STN) type, an in-plane switching (IPS) type, or the like can be used.

However, especially when considering vehicle TVs, tablet terminals or the like as the application of the display, the twisted Nematic (TN) type liquid crystal panel is preferable. This is due to a fact that the TN type is excellent in the resistance to vibration and the application temperature range. The characteristics of the TN type liquid crystal will be described below in detail.

The reason of excellent vibration resistance of the TN type liquid crystal is roughly divided into two factors. One employs a normally white mode, and the other is being less affected by the display characteristics for displacement in a cell thickness direction.

The TN type generally employs a normally white mode, and causes the liquid crystal molecules to be oriented in a direction perpendicular to the cell thickness due to an electric field generated by application of a voltage at the time of black display. When the display is subjected to vibration, even if fluctuation occurs in the liquid crystal molecules, the black is guaranteed by the binding force due to an electric field, such that it is possible to ensure contrast, and suppress the influence on the display characteristics to be small.

Further, when a small displacement occurs due to vibration in the cell thickness direction, the size of the effect on the transmittance is different depending on a polarization method of the liquid crystal molecules. In a case where incident light is polarized by optical rotation as in the TN type, even if the cell thickness is somewhat changed, the twist angle of the liquid crystal molecules is not changed, such that a change in the polarized light quantity is small. In contrast, in a VA type, an IPS type, or the like, which is popular in recent years, the incident light is polarized by birefringence, such that cell thickness change affects directly to the polarized light quantity. The transmittance of the liquid crystal cell changes due to this change in the polarized light quantity.

Further, a description will be made regarding the effects on the liquid crystal in an applied electric field direction, in view of electro-optics. In a case of ignoring the back-flow effect, the energy state of the liquid crystal molecules in the cell is determined by the torque balance of electrostatic energy (FE) due to an electric field and molecule-specific elastic energy (FD). A critical value at which the FE is over the FD (binding force due to anchoring of a substrate interface) and the reorientation (Fredericks transition) of a director occurs is a threshold voltage, and the direction of the electric field has a great influence on this threshold. Since an electric field is applied in the cell thickness direction in the TN type, FE and FD vary in an inversely proportional manner, due to the displacement of the cell thickness, and as a result, the threshold does not change. In contrast, since a distance between the electrodes does not vary with respect to the displacement of the cell thickness in a horizontal electric field method such as an IPS type, the FE is not affected, and the FD varies in an inversely proportional manner. As a result, the voltage threshold has an inversely proportional relationship with the cell thickness, and is greatly affected.

Since the changes in the transmittance and the threshold voltage with respect to the displacement in the cell thickness direction in the TN type are smaller than those of other liquid crystal display types from the above, a V-T curve does not vary greatly and the influence on display characteristics becomes small. The excellent vibration resistance of the above-mentioned TN type is due to these characteristics.

Next, a description will be made regarding characteristics for the application temperature range of TN type.

First, the display characteristics are affected by a normally white mode. When molecular fluctuation due to heat is generated, since the black display is guaranteed by the binding force due to the electric field, influence on the display characteristics becomes smaller as compared with the normally black method. Therefore, the display characteristics are not relatively impaired, even at a temperature range close to a transition temperature to the isotropic phase liquid.

It also contributes to using the nematic liquid crystal molecules of the positive type as the base material of the liquid crystal. The nematic liquid crystal has a positive type of a positive dielectric constant difference ($\Delta\varepsilon$) and a negative type of a negative dielectric constant difference ($\Delta\varepsilon$). Since the TN type is oriented to the major axis side of the liquid crystal molecules when a voltage is applied, it is the positive type; and since the VA type is oriented to the minor axis side, it is the negative type. While the positive type basically has a polar group at the end (a major axis side), the negative type has a polar group on the side (a minor axis side). Therefore, since the intermolecular force generated by hydrogen bonding is increased in the minor axis direction in the negative type and the steric hindrance occurs due to a lateral substituent, a nematic phase is destabilized, and the application temperature range is likely to be limited as compared to the positive type.

Further, only one type material which is a base material is not used as the liquid crystal compound, and materials of about 10 to 20 types are mixed so as to satisfy low voltage driving, fast response, and a wide temperature range. If $\Delta\varepsilon$ of the liquid crystal compound of the base material is large, a desired dielectric constant difference can be set by using a small amount, and many other materials such as a material with a low viscosity and a temperature range spreading material can be used. Since the TN type uses a positive-type liquid crystal, it is likely to spread the range of the applicable temperature, while satisfying the other required characteristics.

Thus, the TN type liquid crystal is more desirable for tablet application, or an application where resistance to vibration and heat is requested such as an in-vehicle TV.

Hereinafter, the configuration of the TFT substrate will be described.

A plurality of pixels (not illustrated), each of which is the smallest unit domain of the display, are arranged in a matrix shape on the TFT substrate 121. A plurality of source bus lines (not illustrated) are formed so as to extend in parallel with each other, and a plurality of gate bus lines (not illustrated) are formed so as to extend in parallel with each other, and to be orthogonal to the plurality of source bus lines on the TFT substrate 121.

Therefore, the plurality of source bus lines and the plurality of gate bus lines are formed in a lattice shape on the TFT substrate 121, and a rectangular region partitioned by the adjacent gate bus lines and the adjacent source bus lines is one pixel. The source bus line is connected to the source electrode of the TFT which will be described later, and the gate bus line is connected to the gate electrode of the TFT.

The TFT 130 including a semiconductor layer 126, a gate electrode 127, a source electrode 128, a drain electrode 129, and the like is formed on the surface on the liquid crystal layer 123 side of the transparent substrate 125 which constitutes the TFT substrate 121.

For example, a glass substrate can be used for the transparent substrate 125. For example, the semiconductor layer 126 made of a semiconductor material such as continuous grain silicon (CGS), low-temperature poly-silicon (LPS), or amorphous silicon ($\alpha$-Si) is formed on the transparent substrate 125. In addition, the gate insulating film 131 is formed on the transparent substrate 125 so as to cover the semiconductor layer 126. As the material of the gate insulating film 131, for example, a silicon oxide film, a silicon nitride film, a stacked film thereof, or the like is used.

A gate electrode 127 is formed on the gate insulating film 131 so as to oppose the semiconductor layer 126. As the material of the gate electrode 127, for example, a stacked film of tungsten (W)/tantalum nitride (TaN), molybdenum (Mo), titanium (Ti), aluminum (Al), or the like is used.

A first interlayer insulating film 132 is formed on the gate insulating film 131 so as to cover the gate electrode 127. As the material of the first interlayer insulating film 132, for example, a silicon oxide film, a silicon nitride film, or a stacked film thereof, or the like is used.

A source electrode 128 and a drain electrode 129 are formed on the first interlayer insulating film 132.

The source electrode 128 is connected to the source region of the semiconductor layer 126 through a contact hole 133 passing through the first interlayer insulating film 132 and the gate insulating film 131. Similarly, the drain electrode 129 is connected to the drain region of the semiconductor layer 126 through a contact hole 134 passing through the first interlayer insulating film 132 and the gate insulating film 131.

As the material of the source electrode 128 and the drain electrode 129, the same conductive material as that of the gate electrode 127 described above is used.

A second interlayer insulating film 135 is formed on the first interlayer insulating film 132 so as to cover the source electrode 128 and the drain electrode 129.

As the material of the second interlayer insulating film 45, the same material as that of the first interlayer insulating film 132 described above, or an organic insulating material is used.

A pixel electrode 136 is formed on the second interlayer insulating film 135. The pixel electrode 136 is connected to a drain electrode 129 through a contact hole 137 passing through the second interlayer insulating film 135. Thus, the pixel electrode 136 is connected to a drain region of the semiconductor layer 126, with the drain electrode 129 as a relay electrode.

As a material of the pixel electrode 136, for example, a transparent conductive material such as indium tin oxide (ITO) and indium zinc oxide (IZO) is used.

Through this configuration, a scanning signal is supplied through a gate bus line, and when the TFT 130 is turned on, an image signal supplied to the source electrode 128 through a source bus line is supplied to the pixel electrode 136 through the semiconductor layer 126, and the drain electrode 129. Further, an alignment film 138 is formed on the entire surface of the second interlayer insulating film 135 so as to cover the pixel electrode 136. The alignment film 138 has an alignment regulating force for vertically aligning liquid crystal molecules forming the liquid crystal layer 123. In addition, the form of a TFT may be a bottom gate type TFT illustrated in FIG. 14 or a top gate type TFT.

Meanwhile, a black matrix 140, a color filter 141, a planarization layer 142, an opposing electrode 143, and an alignment film 144 are sequentially formed on the surface of the liquid crystal layer 123 side of the transparent substrate 139 forming the color filter substrate 122.

The black matrix 140 has a function of shielding the transmission of light in the inter-pixel region, and is made of metal such as a multilayer film of chromium (Cr) or Cr/Cr oxide, or a photoresist containing dispersed carbon particles in photosensitive resin.

The color filter 141 includes dyes of respective colors of red (R), green (G), and blue (B), and a color filter 141 of any one of R, G, B is disposed to face one pixel electrode 136 on the TFT substrate 121.

The planarization layer 142 is formed of an insulating film covering the black matrix 140 and the color filter 141, and has a function of relaxing and flattening a step made by the black matrix 140 and the color filter 141.

The opposing electrode 143 is formed on the planarization layer 142. As a material of the opposing electrode 143, the same transparent conductive material as that of the pixel electrode 136 is used.

In addition, an alignment film 144 having a vertical alignment regulating force is formed on the entire surface of the opposing electrode 143.

The color filter 141 may have a polychromatic structure of three colors of R, G, B or more.

As illustrated in FIG. 10, the backlight 101 includes a light source 151 such as a light emitting diode and a cold-cathode tube, and a light guide plate 152 that emits the light emitted from the light source 151 to the liquid crystal panel 103 by utilizing the internal reflection of the light. The backlight 101 may be an edge light type in which the light source is arranged on the end face of the light guide, and the light source may be a direct type in which the light source is arranged immediately below the liquid crystal panel 103. In addition, a first polarizer 102 functioning as a polarizer is provided between the backlight 11 and the liquid crystal panel 103. In addition, a second polarizer 104 functioning as an analyzer is provided between the liquid crystal panel 103 and the light diffusing member 105.

In the present embodiment, since the light diffusing member 105 is manufactured by any one of the light-diffusing-member manufacturing methods and manufacturing devices of the above-mentioned first to sixth embodiments, the negative photosensitive resin is sufficiently cured on the surface layer of the light diffusion portion 112, and thus the hardness of the light diffusion portion 112 is high, and as a result, the hardness of the light diffusion portion 112 is high. In addition, the light diffusion portion 112 is excellent in the thermal stability, and even if it is used in liquid crystal display 100 for a long time, deterioration due to heat is small. Therefore, deterioration in characteristics due to long-term use is small.

If the application temperature is wide as described above, the TN type liquid crystal excellent in the vibration resistance and the light-diffusing film manufactured by the present embodiment are combined and used, such that it is possible to realize a liquid crystal display which is excellent in thermal stability and vibration resistance, and excellent in viewing angle characteristics.

(2) Second Embodiment

Figure 15:
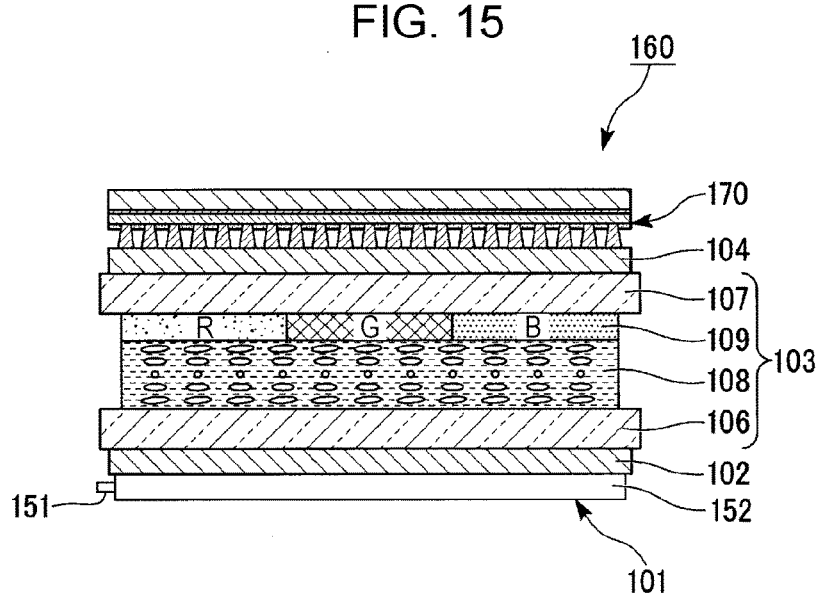
FIG. 15 is a vertical cross-sectional view illustrating a second embodiment of the liquid crystal display.
Figure 16:
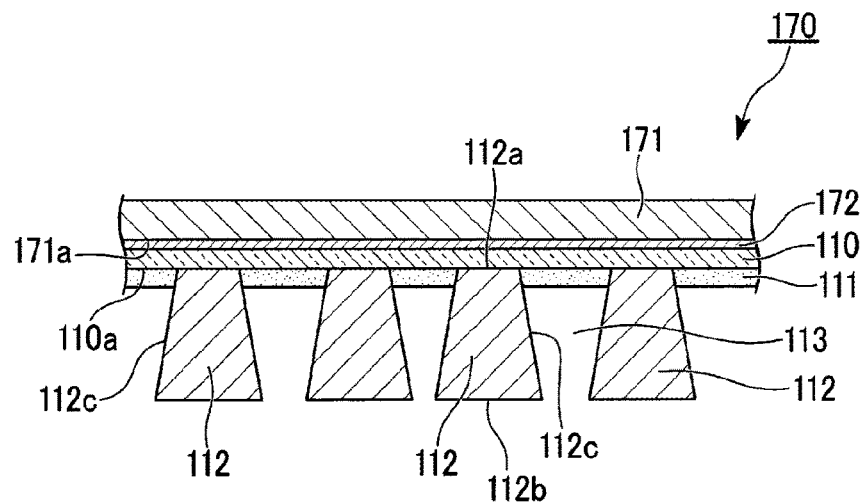
FIG. 16 is a schematic cross-sectional view illustrating a second embodiment of the light diffusing member.

FIG. 15 is a vertical cross-sectional view illustrating an embodiment of a liquid crystal display, as an example of a display of the present embodiment. FIG. 16 is a schematic cross-sectional view illustrating the light diffusing member of the present embodiment.

In FIG. 15, the same components as those illustrated in FIG. 10 are denoted by the same reference numerals, and thus the description thereof will be omitted. In FIG. 16, the same components as those illustrated in FIG. 12 are denoted by the same reference numerals, and thus the description thereof will be omitted.

The liquid crystal display (display) 160 of the present embodiment includes a backlight (light source) 101, a first polarizer 102, a liquid crystal panel 103, a second polarizer 104, and a light diffusing member 170 in a schematic view.

The light diffusing member 170 includes a support base 171 having optical transparency, a base 110 having optical transparency which is stacked on one surface (a surface on the back side) 171a of the support base 171 through an adhesive layer 172, a plurality of light shielding layers 111 which are formed on one surface (a surface on the back side) 110a of the base 110, and light diffusion portions 112 which are formed on regions other than the region having the light shielding layers 111 formed therein, on one surface 110a of the base 110 in a schematic view.

In addition, as the support base 171 forming the light diffusing member 170, a base made of appropriate transparent resin (optical transparency) such as acryl-based polymer, olefin-based polymer, vinyl-based polymer, cellulose-based polymer, amide-based polymer, fluorine-based polymer, urethane-based polymer, silicone-based polymer, and imide-based polymer, or tempered glass is used.

As the support base 171, for example, transparent resin such as a triacetyl cellulose (TAC) film, a polyethylene terephthalate (PET) film, a cycloolefin polymer (COP) film, a polycarbonate (PC) film, a polyethylene naphthalate (PEN) film, a polyether sulfone (PES) film, a polyimide (PI) film, and a polymethyl methacrylate (PMMA) film, or tempered glass is preferably used.

The support base 171 has a larger thickness and a higher rigidity than the base 110. In addition, the material of the support base 171 is not limited to the above materials, and materials with optical transparency having a larger thickness and a higher rigidity than the base 110 can be appropriately selected.

However, it is preferable that the thickness of the support base 171 is thinner to an extent that does not impair the heat resistance and mechanical strength. The reason is that there is a possibility of the occurrence of blurring of the display as the thickness of the support base 171 is increased. Further, it is preferable that the total light transmittance of the support base 20 is 90% or more in the provisions of the JIS K7361-1. If the total light transmittance is 90% or more, sufficient transparency is obtained.

As the adhesive layer 172, adhesive material such as rubber-based, acryl-based, silicone-based, vinyl alkyl ether-based, polyvinyl alcohol-based, polyvinylpyrrolidone-based, polyacrylamide-based, or a cellulose-based adhesive, can be used according to the bonding target. In particular, an adhesive material which is excellent in transparency, weather resistance, and the like is preferably used.

In the liquid crystal display 160, the light diffusing member 170 and the first polarizer 102 are not bonded through an adhesive or the like, and the light diffusing member 170 is arranged in contact with the first polarizer 102.

In the present embodiment, since the light diffusing member 170 includes the support base 171, the light diffusing member 170 is excellent in the thermal stability, and deterioration due to heat is small even if it is used in the liquid crystal display 160 for a long time. Therefore, deterioration in characteristics due to long-term use is small. In addition, since the light diffusing member 105 is disposed in the exposed state, it is susceptible to external stimuli, but the hardness of the light diffusion portion 112 is high, such that deformation due to external stimuli is small.

EXAMPLES

Following is a more detailed description of the present invention using examples, but the present invention is not limited to the following examples.

Example

In the first embodiment of the light-diffusing-member manufacturing method described above, the light diffusing member was manufactured using the dry film resist as the negative photosensitive resin.

Materials with acryl-based polymer as a main component were used as the dry film resist.

In the light diffusion portion formation step, the dry film resist was developed at 30° C. for 45 seconds using 1 wt % of sodium carbonate aqueous solution as the alkali developing solution. The pH of the developing solution was 11.6.

The dry film resist after development was washed with pure water of 25° C. for 15 seconds.

In the acid treatment step, a light diffusion portion formed with a dry film resist after water-washing was treated with acid at 25° C. for 45 seconds using 1 wt % of acetic acid as the acid solution. The pH of the acid solution was 2.8.

Comparative Example

The light diffusing member was manufactured in the same manner as in the example, except for not performing the acid treatment.

[Evaluation of Thermal Stability]
(Evaluation Using Reflected Light Flux Amount)

Figure 17:
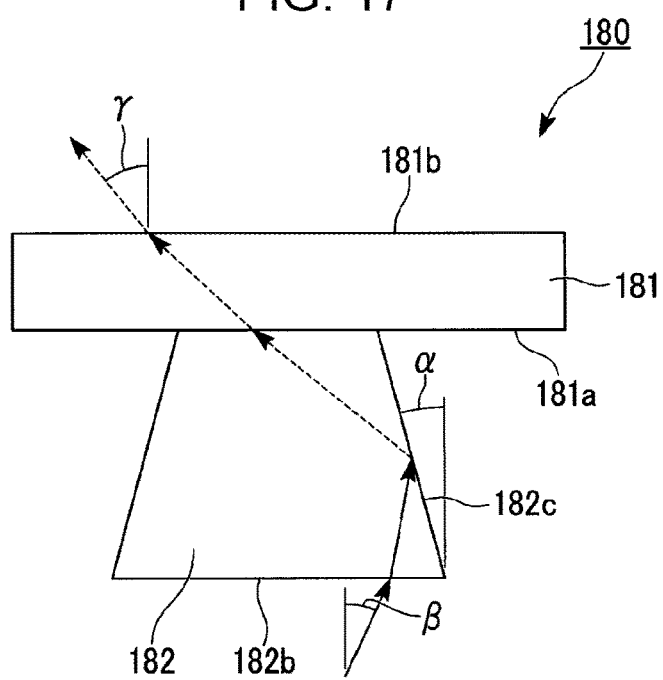
FIG. 17 is a schematic cross-sectional view illustrating the light diffusing member of an example and a light diffusing member of a comparative example.

FIG. 17 is a schematic cross-sectional view illustrating the light diffusing member of the example and the light diffusing member of the comparative example.

In FIG. 17, a light diffusing member 180 includes a base 181, and a light diffusion portion 182 formed on one surface 181a thereof, in a schematic view, for simplicity of explanation. In the light diffusing member 180, the inclination angle α (an angle made by the normal of one surface 181a of the base 181 and the side surface 182c of the light diffusion portion 182) of the side surface 182c of the light diffusion portion 182 was 5°.

The refractive index of the base 181 was 1.50, and the refractive index of the light diffusion portion 182 was 1.60.

As illustrated in FIG. 17, light was incident on the light incident end surface 182b of the light diffusion portion 182 of the light diffusing member 180 from the light source such that the angle β made by the light and the normal of the light incident end surface 182b was 20°, the light was reflected by the side surface 182c of the light diffusion portion 182, and the light flux amount of the light (reflected light) that was emitted at the angle (reflection angle) γ of 38° made by the light and the normal of the other surface 181b was measured at the other surface 181b of the base 181. A goniophotometer was used for measurement of the light flux amount of the reflected light. The results are represented in Table 1.

Next, the light diffusing member of the example and the light diffusing member of the comparative example were left in a thermostatic bath of humidity 0% RH and temperature 80° C. for 100 hours.

Thereafter, as described above, the light flux amounts of the reflected light of the light diffusing member of the example and the light diffusing member of the comparative example were measured. The results are represented in Table 1.

TABLE 1

| | EXAMPLE 1 | COMPARATIVE EXAMPLE 1 |
|---|---|---|
| LIGHT FLUX AMOUNT OF REFLECTED LIGHT BEFORE HIGH TEMPERATURE EXPOSURE [a.u.] | 0.0012 | 0.0012 |
| LIGHT FLUX AMOUNT OF REFLECTED LIGHT AFTER HIGH TEMPERATURE EXPOSURE [a.u.] | 0.0012 | 0.008 |

From the results represented in Table 1, in the light diffusing member of the example, a change in the light flux amount of the reflected light before (before high heat exposure) and after (after high heat exposure) the light diffusing member was left in a thermostatic bath of humidity 0% RH and temperature 80° C. was not found.

Meanwhile, it was found that the light flux amount of the reflected light after high heat exposure was lower than the light flux amount of the reflected light before high heat exposure, in the light diffusing member of the comparative example.

(Evaluation Using 45° Brightness Increase Rate)

After the light diffusing member of the example or the comparative example was bonded to the viewing side of the liquid crystal display (TN TV), a brightness increase rate (the brightness at the time of bonding the light diffusing member/the brightness before bonding the light diffusing member) was measured in a downward direction of 45° of each of liquid crystal display. In addition, the brightness was measured by a viewing angle characteristic measuring evaluation device. The results are represented in Table 2.

Next, each liquid crystal display was left in the thermostatic bath of humidity 0% RH and temperature 80° C. for 100 hours.

Thereafter, as described above, the brightness increase rate was measured for each liquid crystal display. The results are represented in Table 2.

TABLE 2

|  | EXAMPLE 1 | COMPARATIVE EXAMPLE 1 |
|---|---|---|
| BRIGHTNESS INCREASE RATE IN DOWNWARD DIRECTION OF 45° BEFORE HIGH TEMPERATURE EXPOSURE [%] | 212 | 210 |
| BRIGHTNESS INCREASE RATE IN DOWNWARD DIRECTION OF 45° AFTER HIGH TEMPERATURE EXPOSURE [%] | 211 | 201 |

From the results represented in Table 2, it was found that a liquid crystal display to which the light diffusing member of the example (with acid treatment) was bonded has a lower reduction in the brightness increase rate than a liquid crystal display to which the light diffusing member of the comparative example (without acid treatment) was bonded, in a downward direction of 45°.

From the results of Tables 1 and 2, while the light diffusing member of the comparative example (without acid treatment) had a large amount of deformation due to heat, the light diffusing member of the example (with acid treatment) had a small amount of deformation due to heat.

However, in a case where the main component of the dry film resist is acryl-based polymer, the ionization degree of the carboxyl group contained in the dry film resist in water washing (after exposure) is considered to be about 0.6 to 0.9. In terms of that the light diffusing member of the comparative example (without acid treatment) has a large amount of deformation due to heat, in order to obtain a sufficient effect to remove water from the light diffusion portion by acid treatment, the pH of the acid solution needs to be lower than 5.6.

In addition, in an environment in which the air is sufficiently blended, pure water dissolves carbon dioxide in the air, and pH may be lowered to about 5.6.

Here, in a case where the light diffusing member is treated with acid by using slightly acidic water which is sufficiently aerated and of which pH is lowered as the acid treatment solution, sufficient thermal stability cannot be obtained in the light diffusing member, as in the case where the acid treatment is performed on the light diffusing member with an acidic solution such as acetic acid. In other words, since water cannot be removed from the light diffusion portion by only washing the light diffusing member using slightly acidic water, it is necessary perform the acid treatment on the light diffusing member, with an acid treatment solution having a pH of the region where the ionization degree of the carboxyl groups is largely lowered.

[Evaluation of Shrinkage Rate]

With respect to the light diffusing member of the example and the light diffusing member of the comparative example, the shrinkage rates of the light diffusion portions through the acid treatment were measured by comparing the thicknesses of the respective light diffusion portions.

The shrinkage rate of the light diffusion portion through the acid treatment is defined by (the thickness of the light diffusion portion of the example)/(the thickness of the light diffusion portion of the comparative example).

As a result, the shrinkage rate of the light diffusion portion through the acid treatment was 0.97.

Since the light diffusing member of the example and the light diffusing member of the comparative example were made of the same material, the volume of the light diffusion portion of the example was reduced, and thus the density of the light diffusion portion of the example was considered to be increased.

Therefore, it is considered that acid treatment promotes curing of a dry film resist that forms the light diffusion portion, and the density of the light diffusion portion is increased.

[Evaluation of Young's Modulus]

Figure 18:
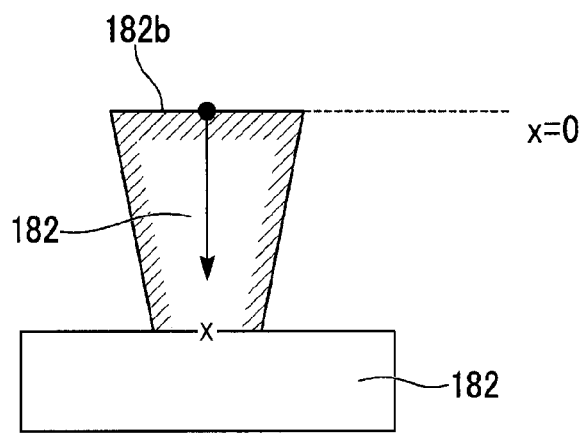
FIG. 18 is a schematic cross-sectional view illustrating a measurement method of Young's modulus of the light diffusing member of the example and the light diffusing member of the comparative example.

FIG. 18 is a schematic cross-sectional view illustrating a measurement method of Young's modulus of the light diffusing member of an example and the light diffusing member of a comparative example.

In FIG. 18, the light diffusing member 180 includes the base 181, and the light diffusion portion 182 which is formed on one surface 181a thereof, in a schematic view, for simplicity of explanation.

As illustrated in FIG. 18, the Young's modulus distribution of the light diffusion portion 182 on the x-axis was measured by a Nanoindentation method (a method of pushing an indenter vertically, and measuring a relationship between the load and the indentation depth), by using the light incident end surface 182b of the light diffusion portion 182 as a reference surface (X=0), and the thickness direction of the light diffusion portion 182 as the x-axis. The measurement of the Young's modulus was performed on the respective light diffusing members of the example and the comparative example. The result is illustrated in FIG. 19.

Figure 19:
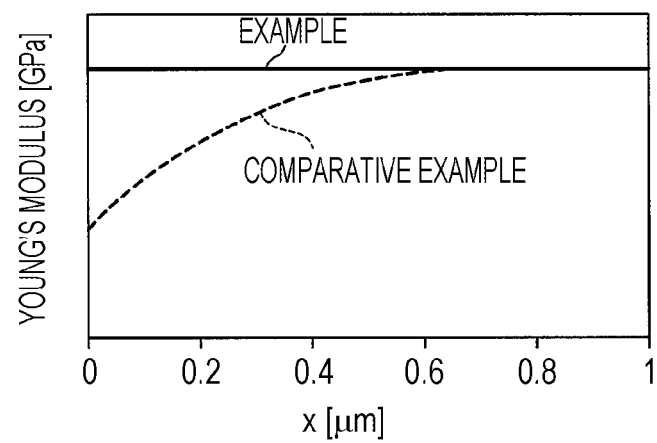
FIG. 19 is a graph illustrating a distribution of Young's modulus of a light diffusion portion in an x-axis, in the light diffusing member of the example and the light diffusing member of the comparative example.

From the result of FIG. 19, it was found that the light diffusing member of the example had a larger Young's modulus in the surface layer of the light diffusion portion, as compared with the light diffusing member of the comparative example.

[Evaluation of Water Removal Effect of Light Diffusion Portion]

The mass moisture contents (%) of the light diffusing member of the example and the light diffusing member of the comparative example were measured.

The mass moisture content was measured by a micro thermogravimetric analysis (TGA). Here, the mass moisture content is defined by (mass of water)/(mass of water+light diffusing member after dry).

Next, the light diffusing member of the example and the light diffusing member of the comparative example were left in the thermostatic bath of humidity 0% RH and temperature 80° C. for 24 hours.

Thereafter, as described above, the mass moisture contents of the light diffusing member of the example and the light diffusing member of the comparative example were measured. The result is illustrated in FIG. 20.

Figure 20:
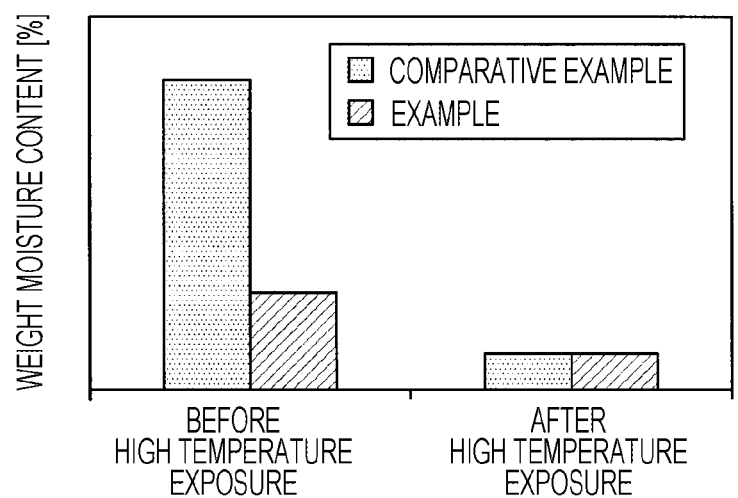
FIG. 20 is a graph illustrating a result obtained by measuring a mass moisture content of the light diffusing member of an example and the light diffusing member of a comparative example.

From the result of FIG. 20, it was found that the light diffusing member of the example had a less reduction in a moisture content due to high temperature exposure, as compared with the light diffusing member of the comparative example. In other words, it was found that in the light diffusing member of the example, water was removed from the light diffusion portion, by acid treatment.

INDUSTRIAL APPLICABILITY

The present invention is available in various displays such as a liquid crystal display, an organic electroluminescent display, and a plasma display.

REFERENCE SIGNS LIST

1 MANUFACTURING DEVICE
11 SENDING ROLLER
12 WINDING ROLLER
13 PRINTER
14 BAR COATER
15 FIRST DRYING DEVICE
16 NEGATIVE PHOTOSENSITIVE RESIN LAYER FORMING DEVICE
17 DEVELOPMENT DEVICE
18 ACID TREATMENT DEVICE
19 SECOND DRYING DEVICE
20 EXPOSURE DEVICE
41 FIRST WATER WASHING DEVICE
42 ACID DEVICE
43 SECOND WATER WASHING DEVICE
100 LIQUID CRYSTAL DISPLAY (DISPLAY)
101 BACKLIGHT (LIGHT SOURCE)
102 FIRST POLARIZER
103 LIQUID CRYSTAL PANEL
104 SECOND POLARIZER
105 LIGHT DIFFUSING MEMBER
106 TFT SUBSTRATE
107 COLOR FILTER SUBSTRATE
108 LIQUID CRYSTAL LAYER
109 COLOR FILTER
110 BASE
111 LIGHT SHIELDING LAYER
112 LIGHT DIFFUSION PORTION
113 AIR-CAVITY
114 ADHESIVE LAYER
121 TFT SUBSTRATE
122 COLOR FILTER SUBSTRATE
123 LIQUID CRYSTAL LAYER
124 SPACER
125 TRANSPARENT SUBSTRATE
126 SEMICONDUCTOR LAYER
127 GATE ELECTRODE
128 SOURCE ELECTRODE
129 DRAIN ELECTRODE
130 TFT
131 GATE INSULATING FILM
132 FIRST INTERLAYER INSULATING FILM
133, 134, 137 CONTACT HOLE
135 SECOND INTERLAYER INSULATING FILM
136 PIXEL ELECTRODE
138 ALIGNMENT FILM
139 TRANSPARENT SUBSTRATE
140 BLACK MATRIX
141 COLOR FILTER
142 PLANARIZATION LAYER
143 OPPOSING ELECTRODE
144 ALIGNMENT FILM
151 LIGHT SOURCE
152 LIGHT GUIDE PLATE

What is claimed is:

1. A light-diffusing-member manufacturing method comprising:
    forming a light shielding layer on a first surface of a base with optical transparency;
    forming a negative photosensitive resin layer with optical transparency so as to cover the light shielding layer on the first surface, a main component polymer of the negative photosensitive resin layer being an acryl-based polymer;
    exposing the negative photosensitive resin layer by irradiating the negative photosensitive resin layer with ultraviolet light, from a second surface of the base, the second surface being opposite to the first surface, the irradiation being performed through a first region of the base, the first region being other than a second region of the base, the light shielding layer being formed in the second region;
    forming, after the exposure, a light diffusion portion having a light-emitting end surface on a base side, and having a light incident end surface having a first area larger than a second area of the light-emitting end surface on an opposite side of the base side, the light diffusion portion being formed on the first surface, the forming of the light diffusion portion being performed by developing the negative photosensitive resin layer with an alkali developing solution, such that an ionization degree of the negative photosensitive resin layer becomes 0.95 or more based on an ionization degree curve of the negative photosensitive resin layer; and
    performing an acid treatment on the light diffusion portion with an acid solution, after removing the alkali developing solution which is adhered to the light diffusion portion and suspended matter in the alkali developing solution in the negative photosensitive resin layer, so as to lower the ionization degree of the negative photosensitive resin layer which is in an ionized state due to the alkali developing solution.

2. The light-diffusing-member manufacturing method according to claim 1,
    wherein in the performing of the acid treatment, the acid solution is diffused into the light diffusion portion by physical stimuli.

3. The light-diffusing-member manufacturing method according to claim 1,
    wherein in the performing of the acid treatment, the light diffusion portion and the acid solution are heated.

4. The light-diffusing-member manufacturing method according to claim 1,
    wherein in the performing of the acid treatment, the acid solution is vaporized, and the vaporized acid solution is diffused into the light diffusion portion.

5. The light-diffusing-member manufacturing method according to claim 1,
    wherein the acid treatment is performed such that the ionization degree of the negative photosensitive resin layer becomes 0.05 or less based on the ionization degree curve.

* * * * *